(12) United States Patent
Sharifi

(10) Patent No.: US 7,265,926 B2
(45) Date of Patent: Sep. 4, 2007

(54) HIGH SPEED HARD DISK DRIVE WITH SYMMETRIC WRITER

(75) Inventor: Reza Sharifi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/889,770

(22) Filed: Jul. 13, 2004

(65) Prior Publication Data

US 2006/0012902 A1   Jan. 19, 2006

Related U.S. Application Data

(60) Provisional application No. 60/515,498, filed on Oct. 29, 2003.

(51) Int. Cl.
*G11B 5/02* (2006.01)

(52) U.S. Cl. .............................. 360/68; 360/46; 360/65; 360/66; 360/67

(58) Field of Classification Search ...................... None
See application file for complete search history.

(56) References Cited

U.S. PATENT DOCUMENTS

| | | | | |
|---|---|---|---|---|
| 5,287,231 A | * | 2/1994 | Shier et al. ................... 360/68 |
| 5,287,321 A | * | 2/1994 | Shiffer, II ............... 365/230.01 |
| 5,869,988 A | * | 2/1999 | Jusuf et al. .................. 327/110 |
| 6,121,800 A | * | 9/2000 | Leighton et al. ............ 327/110 |
| 6,166,869 A | * | 12/2000 | Pidutti et al. .................. 360/46 |
| 6,218,903 B1 | * | 4/2001 | Hashimoto et al. ......... 330/277 |
| 6,236,246 B1 | * | 5/2001 | Leighton et al. ............ 327/110 |
| 6,271,978 B1 | * | 8/2001 | Block et al. ................... 360/46 |
| 6,297,921 B1 | * | 10/2001 | Price et al. .................... 360/68 |
| 6,373,298 B1 | * | 4/2002 | Teterud et al. .............. 327/110 |
| 6,404,579 B1 | * | 6/2002 | Ranmuthu et al. ............ 360/66 |
| 6,429,987 B1 | * | 8/2002 | Cheng .......................... 360/46 |
| 6,456,148 B2 | * | 9/2002 | Patti et al. ................... 327/424 |
| 6,495,317 B1 | * | 12/2002 | Lacombe ...................... 360/68 |
| 6,504,666 B1 | * | 1/2003 | Patti et al. ..................... 360/68 |
| 6,879,455 B2 | * | 4/2005 | Ngo et al. ..................... 360/68 |
| 6,970,316 B2 | * | 11/2005 | Venca et al. .................. 360/61 |
| 2005/0141120 A1 | * | 6/2005 | Kuehlwein et al. ........... 360/67 |

* cited by examiner

*Primary Examiner*—Andrea Wellington
*Assistant Examiner*—Dismery Mercedes
(74) *Attorney, Agent, or Firm*—Dolly Y. Wu; W. James Brady, III; Frederick J. Telecky, Jr.

(57) ABSTRACT

A disk drive data storage system, comprising a magnetic disk a head for writing data to the disk, and circuitry for providing a first voltage (HWX) to a first node ($N_1$) and a second voltage (HWY) to a second node ($N_2$). The first and second voltage circuitry comprises a first transistor ($42_{1P2}$) of a first type and coupled to the first node, a first transistor ($42_{2N2}$) of a second type and coupled to the second node, a second transistor ($44_{1P2}$) of the first type and coupled to the second node, and a second transistor ($44_{2N2}$) of the second type and coupled to the node. The system also comprises circuitry for providing, during a first time period, a first biasing signal (VNDY) and a second biasing signal (VPDY) and circuitry for providing, during a second time period, a third biasing signal (VNDX) and a fourth biasing signal (VPDX).

21 Claims, 14 Drawing Sheets

HIGH SPEED HARD DISK DRIVE WITH SYMMETRIC WRITER

CROSS-REFERENCES TO RELATED APPLICATION

This application claims priority under 35 USC §119 of provisional application Ser. No. 60/515,498, filed Oct. 29, 2003.

STATEMENT REGARDING FEDERALLY SPONSORED RESEARCH OR DEVELOPMENT

Not Applicable.

BACKGROUND OF THE INVENTION

The present embodiments relate to hard disk drives and are more particularly directed to a disk drive control circuit, such as may be included within a disk drive pre-amplifier, for providing voltage waveforms to drive the disk drive write mechanism.

Computer use is extremely prevalent and beneficial in today's society and has fueled ongoing efforts at improving all aspects of computer technology and design. Computers take various forms, such as the examples of desktops, workstations, or portable devices. Many of these computers include various types of storage devices, and in connection with the preferred embodiments described later, one of these devices is the hard disk drive. A hard disk drive or "hard drive" is characterized in that its read/write magnetic medium is typically not removable from the location of the read/write heads, although in some instances there may be some aspect of removability. In any event, in response to factors such as demand and competition, technology continues to strive to increase the performance of hard disk drives, such as by increasing the speed at which the drive reads and writes data relative to its magnetic disk medium. Such advancements include matters of various complexity, particularly with speeds now in the range of four gigabits per second ("Gps"). Further, various approaches of the prior art that may have proven workable in slower hard disk drives are now becoming limitations at advanced read/write speeds.

By way of further background, the disk drive write head may be electrically understood as in effect an inductor that is proximate the disk medium. Two different voltages are applied, respectively, to the two terminals of the inductor so as to generate a current through it. A generated current in a first direction writes a first binary state to the nearby disk medium, while a current generated in a second, and opposite, direction writes a second binary state to the disk medium. In generating the above-described voltages, it is known to be desirable to generate either directional current waveform to include an overshoot that is then followed by a DC component. In other words, the current waveform settles to an absolute value that is less than that of the overshoot, where that value is desired to write a corresponding binary state. Only by way of example, an overshoot of 120 mA may be generated and followed by a DC current of 40 mA to write a binary 1, while an overshoot of –120 mA may be generated and followed by a DC current of –40 mA to write a binary 0.

In connection with the preferred embodiments described later, the present inventor recognizes a limitation of prior art disk drives with respect to the waveforms that are generated to drive the drive's write head. Specifically, as drive speeds have increased, then there is a corresponding shorter period of time for the drive currents to change between writing different binary states. For example, for a 4 Gps write, each write must occur in 250 picoseconds. Thus, if a write of a binary 1 occurs in one cycle followed by a write of a binary 0 in the next successive cycle, then the voltage waveforms used to drive the head (i.e., as an inductor) must switch state in 250 picoseconds. While generating waveforms to accomplish this may be feasible in the prior art, the present inventor has observed that the change in magnetic field that occurs as a result of this fast switching of voltages may have a negative effect on the drive's nearby read head. More particularly, typically the tracer for the read head is close to the tracer for the write head. Thus, there is a coupling, or cross-talk, of the magnetic field generated by the write head tracer to the nearby read head tracer. Further, in contemporary drives the physical components of the read head may be very sensitive, and the large energy imposed on the device by the cross-talk may physically damage the read head. This cross-talk problem will likely become worse as disk drive write speeds continue to increase.

As a result of the preceding, there arises a need to address the drawbacks of the prior art as is achieved by the preferred embodiments described below.

BRIEF SUMMARY OF THE INVENTION

In one preferred embodiment, there is a disk drive data storage system. The system comprises a magnetic disk and a head for writing data to the disk. The system also comprises circuitry for providing a first voltage to a first node and a second voltage to a second node. The head is coupled to the first and second nodes such that a data state is written to the disk in response to the first and second voltage. The first and second voltage circuitry comprises a first transistor of a first type and coupled to the first node, a first transistor of a second type and coupled to the second node, a second transistor of the first type and coupled to the second node, and a second transistor of the second type and coupled to the second node. The system also comprises circuitry for coupling a first biasing signal to the first transistor of the first type at a first time, and comprising a signal path for the first biasing signal that passes through a base-emitter junction of transistors of both the first and second type. The system also comprises circuitry for coupling a second biasing signal to the first transistor of the second type at the first time, and comprising a signal path for the second biasing signal that passes through a base-emitter junction of transistors of both the first and second type. The system also comprises circuitry for coupling a third biasing signal to the second transistor of the first type at a second time, and comprising a signal path for the third biasing signal that passes through a base-emitter junction of transistors of both the first and second type. Lastly, the system also comprises circuitry for coupling a fourth biasing signal to the second transistor of the second type at the second time, and comprising a signal path for the fourth biasing signal that passes through a base-emitter junction of transistors of both the first and second type.

Other aspects are also disclosed and claimed.

DETAILED DESCRIPTION OF THE INVENTION

The present invention is described below in connection with its preferred embodiment, namely as implemented into a magnetic disk drive using an inductive write head and a magnetoresistive read head, with tracers positioned proximate one another and receiving signals from a preamplifier located on a flexible circuit board. The present inventor believes that this invention is especially beneficial in such an application. However, the invention also may be implemented in, and provide significant benefit to, disk drives of other types and construction, including disk drives utilizing different read and write head technology and mechanisms. Accordingly, it is to be understood that the following description is provided by way of example only and is not intended to limit the inventive scope.

Figure 1:
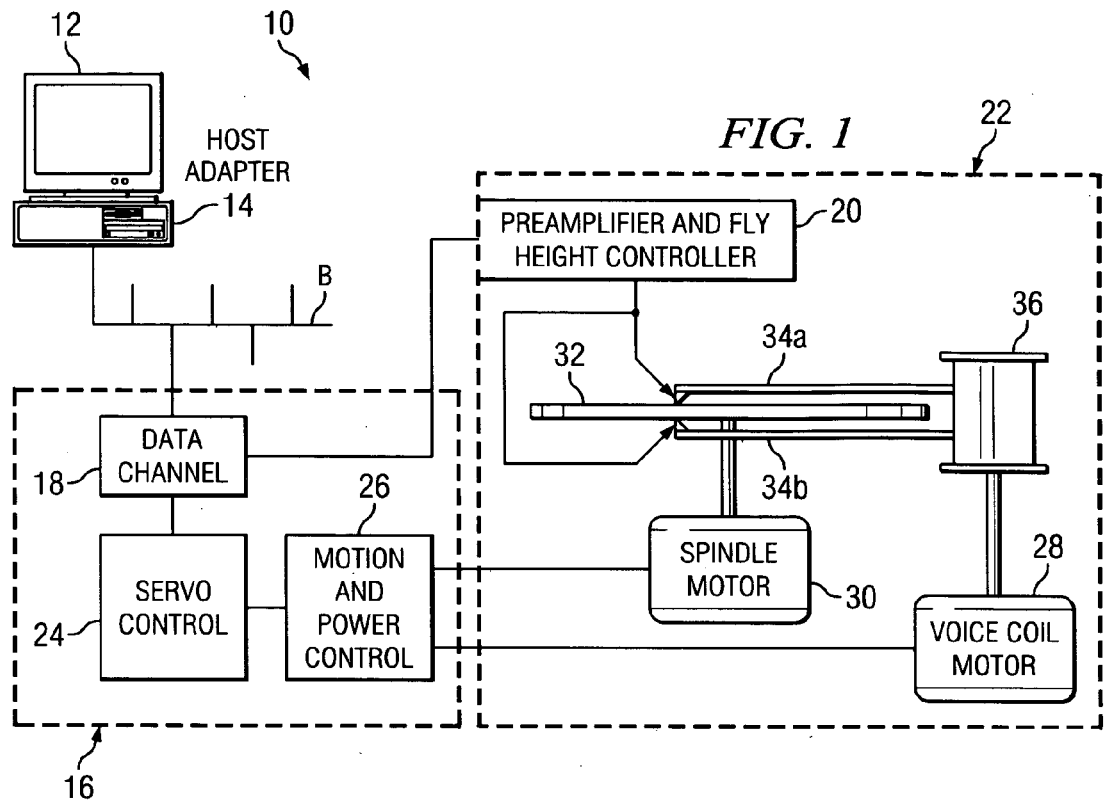
FIG. 1 illustrates an exemplary example of a computer system 10 into which the preferred embodiment is implemented.

FIG. 1 illustrates an exemplary example of a computer system 10 into which the preferred embodiment is implemented. In this example, system 10 includes a computer 12, realized in the conventional manner. For example but not explicitly illustrated in FIG. 1, computer 12 includes a central processing unit ("CPU"), random access memory ("RAM"), video, sound cards or functionality, network interface capability, and the like. Computer 12 also includes a host adapter 14, which connects on one side to an internal system bus (not shown) of computer 12, and on the other side to a bus B. Bus B is preferably implemented according to conventional standards, examples of which include the Enhanced Integrated Drive Electronics ("EIDE") standard or the Small Computer System Interface ("SCSI") standard. Bus B is also connected to a disk drive controller 16. While not shown, other disk storage devices (hard disk controllers, floppy drive controllers, etc.) and other peripherals also may be connected to bus B, as desired and in the conventional manner.

Controller 16 is a conventional disk drive controller as known in the art. In modern disk drives in which the drive electronics are implemented at the disk drive rather than as a controller at computer 12 itself, controller 16 is implemented in a printed circuit board within the disk drive. Of course, in larger scale systems, controller 16 may be implemented within computer 12. In the generalized block diagram of FIG. 1, the components of controller 16 are shown according to their functions, rather than their physical integrated circuits, for the sake of clarity. Typical integrated circuits used to implement disk drive controllers such as controller 16 include a digital signal processor ("DSP"), read-only memory ("ROM") and RAM, other non-volatile storage such as flash RAM, interface circuitry connected to bus B, and other custom logic circuitry. Functionally, controller 16 includes a data channel 18, which is interfaced with bus B and performs the function of communicating data to and from a preamplifier 20 of a head-disk assembly 22. Preamplifier 20, as detailed later, includes one or more tracers that provides appropriate differential voltage signals to one or more read/write head assemblies 34a, 34b, so that data may be written to the storage medium of head-disk assembly 22. Data channel 18 also communicates with a servo control 24, which in turn communicates with a motion and power controller 26, which drives a voice coil motor 28 and a spindle motor 30 in head-disk assembly 22.

Head-disk assembly 22 includes the electronic and mechanical components that are involved in the writing and reading of magnetically stored data. In this example, head-disk assembly 22 includes one or more disks 32 having ferromagnetic surfaces (preferably on both sides) that spin about their axis under the control of spindle motor 30. Read/write head assemblies 34a, 34b are movable by an actuator 36. Accordingly, signals from motion and power control function 26 in controller 16 control spindle motor 30 and voice coil motor 28 so that actuator 36 places the read/write head assemblies 34a, 34b at the desired locations of disk surface 32 to write or read the desired data.

Figure 2:
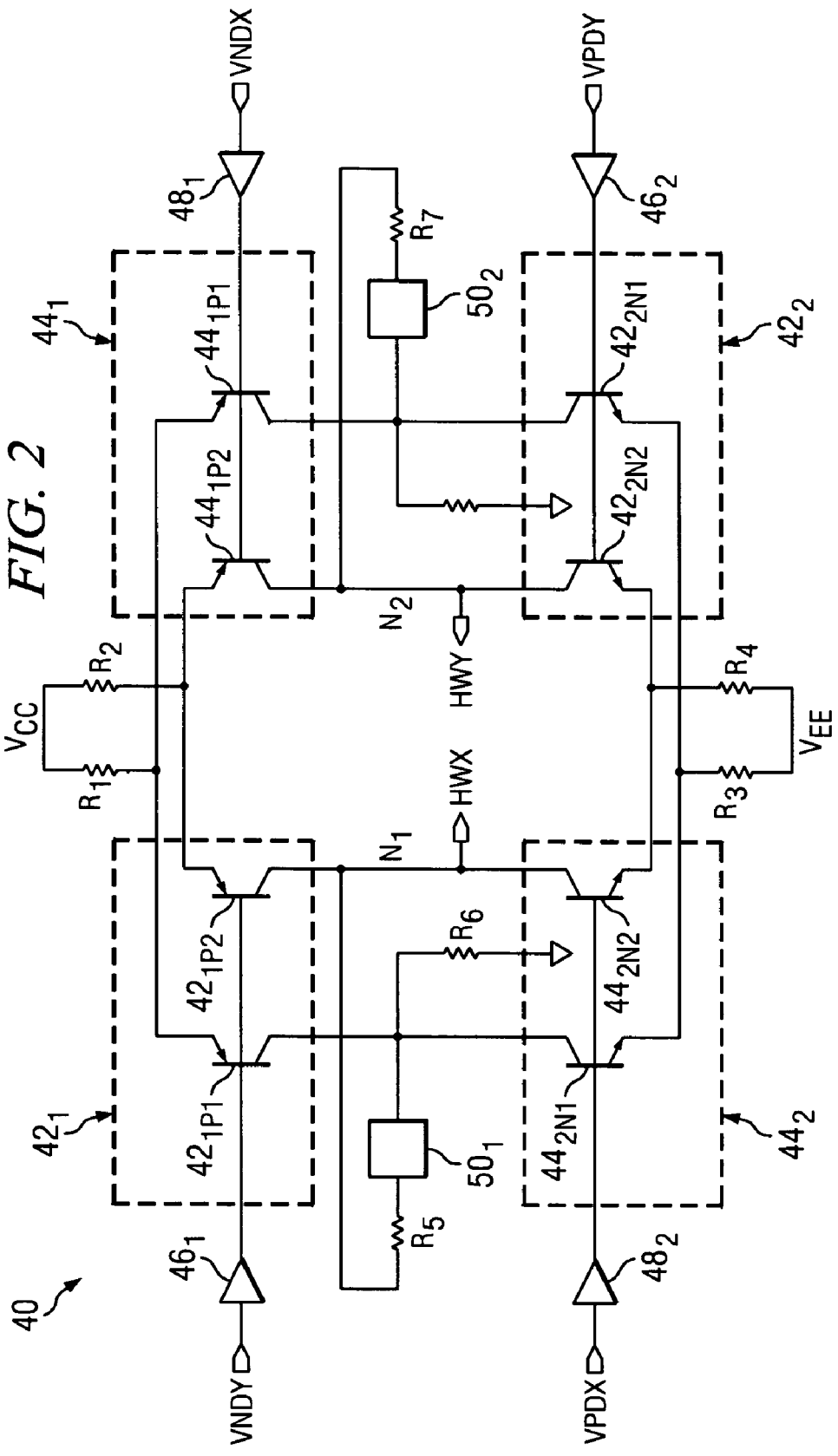
FIG. 2 illustrates a simplified schematic of a writer head assembly supply circuit per the preferred embodiment.

In accordance with the preferred embodiments, circuitry within preamplifier 20 is improved as compared to the prior art, so as to reduce magnetic coupling from the writer traces to the reader traces, where the recognition and consequences of such coupling were detailed earlier in the Background Of The Invention section of this document. Moreover, such an approach may have particular benefits at advanced operational speeds, with a contemporary example being on the order of 4 Gps. Looking then to the preferred embodiment, FIG. 2 illustrates a simplified schematic of a writer head assembly supply circuit designated generally at 40. By way of introduction to circuit 40 and as detailed below, it is coupled between typical analog rail voltage supplies, $V_{CC}$ and $V_{EE}$, which in a contemporary example may be +5 volts and −5 volts, respectively. In response to those voltages as well as four independent biasing signals, VNDY, VNDX, VPDY, and VPDX that are activated in response to data channel 18, it generates differential output voltages HWX and HWY so as to drive the hard disk write head assembly/assemblies (see FIG. 1; not shown in FIG. 2) with voltage signals for inducing a current through the assembly/assemblies and thereby writing data to disk 32. By way of convention and further appreciated later, the four biasing signals are named such that only the "Y" signals (i.e., VNDY, VPDY) or the "X" signals (i.e., VNDX, VPDX) are active at a same time, and where the "VP" in two of those signals represents that the signals ultimately are directed to the P-type base of an NPN bipolar junction transistor ("BJT"), while the "VN" in two of those signals represents that the signals ultimately are directed to the N-type base of a PNP BJT. Further, in the preferred embodiment, circuit 40 is implemented using a symmetric process, such as is achieved in germanium-silicon, whereby the speed of each NPN BJT is approximately the same as that of each PNP BJT.

Looking now in more detail to the devices and connectivity of circuit 40 of FIG. 2, it includes a first pair of drivers $42_1$ and $42_2$ and a second pair of pair of drivers $44_1$ and $44_2$. For reasons detailed below, one driver circuit in each such circuit pair includes PNP BJTs (e.g., driver $42_1$) while the other driver circuit in each such circuit pair includes NPN BJTs (e.g., driver $42_2$). Within driver $42_1$ is a PNP BJT $42_{1P1}$ and a PNP BJT $42_{1P2}$, and within driver $42_2$ is an NPN BJT $42_{2N1}$ and an NPN BJT $42_{2N2}$. Within driver $44_1$ is a PNP BJT $44_{1P1}$ and a PNP BJT $44_{1P2}$, and within driver $44_2$ is an NPN BJT $44_{2N1}$ and an NPN BJT $44_{2N2}$. The bases of the PNP BJTs in circuit $42_1$ are driven by a pre-driver $46_1$, which receives the signal VNDY as an input, and the bases of the NPN BJTs in circuit $42_2$ are driven by a pre-driver $46_2$, which receives the signal VPDY as an input. The bases of the PNP BJTs in circuit $44_1$ are driven by a pre-driver $48_1$, which receives the signal VNDX as an input, and the bases of the NPN BJTs in circuit $44_2$ are driven by a pre-driver $48_2$, which receives the signal VPDX as an input. The respective emitters of PNP BJTs $42_{1P1}$ and $44_{1P1}$ are connected through a resistor $R_1$ to $V_{CC}$, and the respective emitters of PNP BJTs $42_{1P1}$ and $44_{1P2}$ are connected through a resistor $R_2$ to $V_{CC}$. The respective emitters of NPN BJTs $44_{2N1}$ and $42_{2N1}$ are connected through a resistor $R_3$ to $V_{EE}$, and the respective emitters of NPN BJTs $44_{2N2}$ and $42_{2N2}$ are connected through a resistor $R_4$ to $V_{EE}$. The collector of PNP BJT $42_{1P1}$ is connected to the collector of NPN BJT $44_{2N1}$, and the collector of PNP BJT $42_{1P2}$ is connected to the collector of NPN BJT $44_{2N2}$ and at a node $N_1$. The collector of PNP BJT $44_{1P1}$ is connected to the collector of NPN BJT $42_{2N1}$, and the collector of PNP BJT $44_{1P2}$ is connected to the collector of NPN BJT $42_{2N2}$ and at a node $N_2$. Node $N_1$ is also connected through a resistor $R_5$ to a resistance match driver block $50_1$, which is further connected to the collectors of PNP BJT $42_{1P1}$ and NPN BJT $44_{2N1}$ and also through a resistor $R_6$ to ground. Node $N_2$ is also connected through a resistor $R_7$ to a resistance match driver block $50_2$, which is further connected to the collectors of PNP BJT $44_{1P1}$ and NPN BJT $42_{2N1}$ and also through a resistor $R_8$ to ground.

The operation and benefits of circuit 40 are now described, with certain aspects as to particular preferred implementation details explained later so as to simplify the present discussion. As introduced earlier, the inputs signals to circuit 40 are paired such that either the pair of VNDY and VPDY are asserted at a time, or the pair of VNDX and VPDX are asserted at a time. When VNDY and VPDY are asserted, then driver $42_1$ sources current and provides a positive voltage at node $N_1$, while driver $42_2$ sinks current and provides a negative voltage at node $N_2$, thereby providing a first differential voltage at the signals HWX and HWY at nodes $N_1$ and $N_2$, respectively. This first differential voltage is coupled, as shown in FIG. 1, to the write head portion of one of the read/write head assemblies 34a, thereby causing a first binary state to be written to the disk 32 proximate to the write head. Conversely, when VNDX and VPDX are asserted, then driver $44_1$ sources current and provides a positive voltage at node $N_2$, while driver $44_2$ sinks current and provides a negative voltage at node $N_1$, thereby providing a second differential voltage at the signals HWX and HWY at nodes $N_1$ and $N_2$, respectively. This second differential voltage is also coupled, as shown in FIG. 1, to the write head portion of one of the write head assemblies 34a, thereby causing a second binary state to be written to the disk 32 proximate to the write head. As further appreciated below, these two differential voltages are provided in a balanced manner so as to provide a current through the writer traces that has a minimized magnetic coupling to the nearby reader traces.

Figure 3:
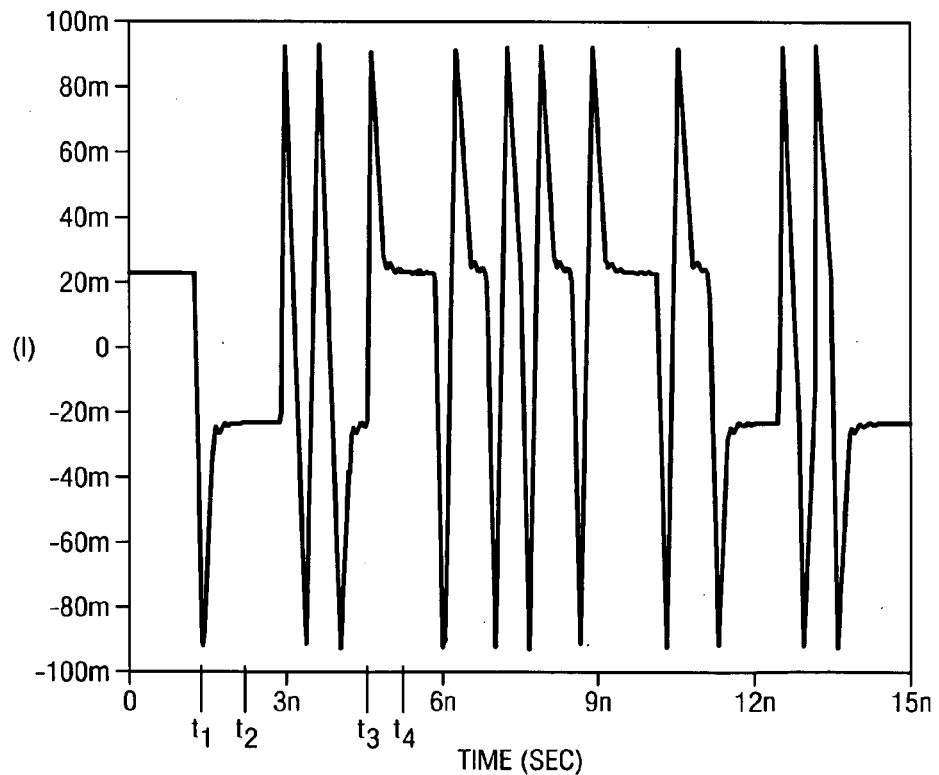
FIG. 3 illustrates a plot of the current induced in a write head in response to the voltages HWX and HWY at nodes $N_1$ and $N_2$, respectively, in FIG. 2.

Having described the general operation of circuit 40, additional benefits are now appreciated from a review of the signals it induces in connection with the write head assembly 34a or 34b. In this regard, FIG. 3 illustrates a plot of the current induced in a write head in response to the voltages HWX and HWY at nodes $N_1$ and $N_2$, respectively, in FIG. 2. In the example of FIG. 3, the induced current is shown for data signaling at a rate of 3 Gps and for a 70 ohm resistive load. In general, it may be appreciated that the signal is as desired as known in the art, including overshoots and DC portions so as to cause a write of one of two binary states. For example, at a time $t_1$, there is shown a negative overshoot, and thereafter following a time $t_2$, the current is shown to resolve to a negative steady state. Thus, the current from times $t_1$ and $t_2$ are sufficient to write a first binary value (e.g., 0) to the disk 18. As another example, at a time $t_3$, there is shown a positive overshoot, and thereafter following a time $t_4$, the current is shown to resolve to a positive steady state. Thus, the current from times $t_3$ and $t_4$ are sufficient to write a second binary value (e.g., 1) to the disk 18. Lastly, note in FIG. 3 that the stand alone peaks represent single bits, while the ones with a DC portion represent more than one consecutive bit, like 00 or 11.

Figure 4:
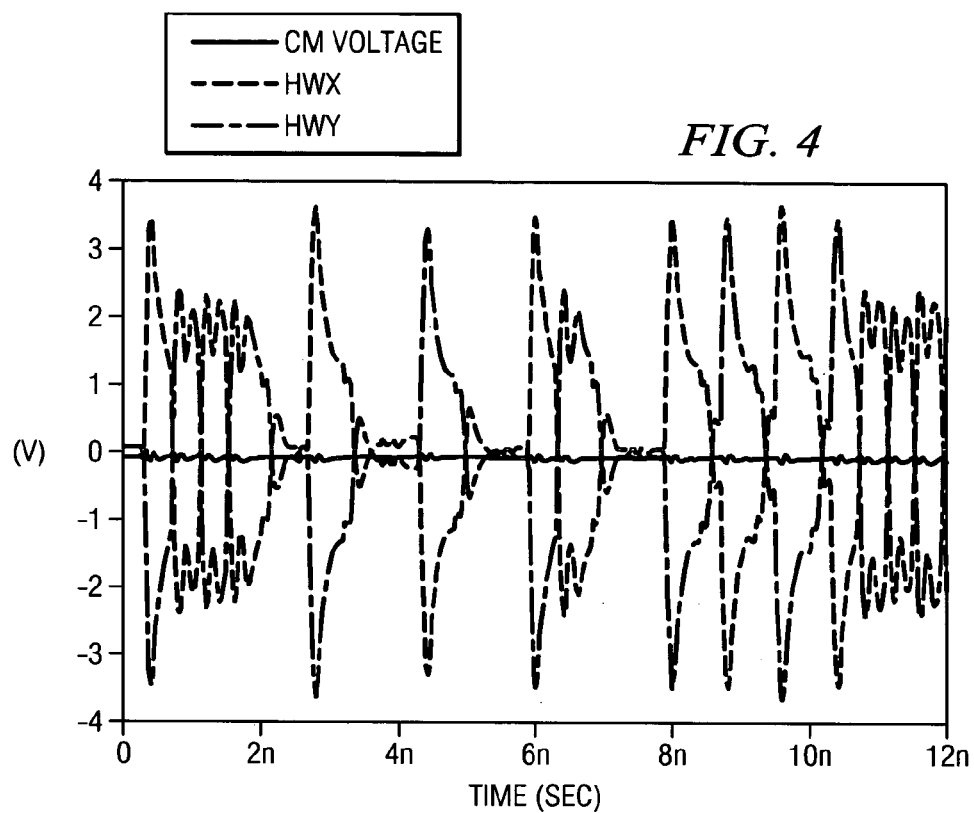
FIG. 4 illustrates a plot of the respective voltages HWX and HWY produced by circuit 40 at its nodes $N_1$ and $N_2$, respectively, in FIG. 2 and in an example of operation at 2.5 Gps and FIG. 4 also illustrates the common mode voltage between HWX and HWY.
Figure 5:
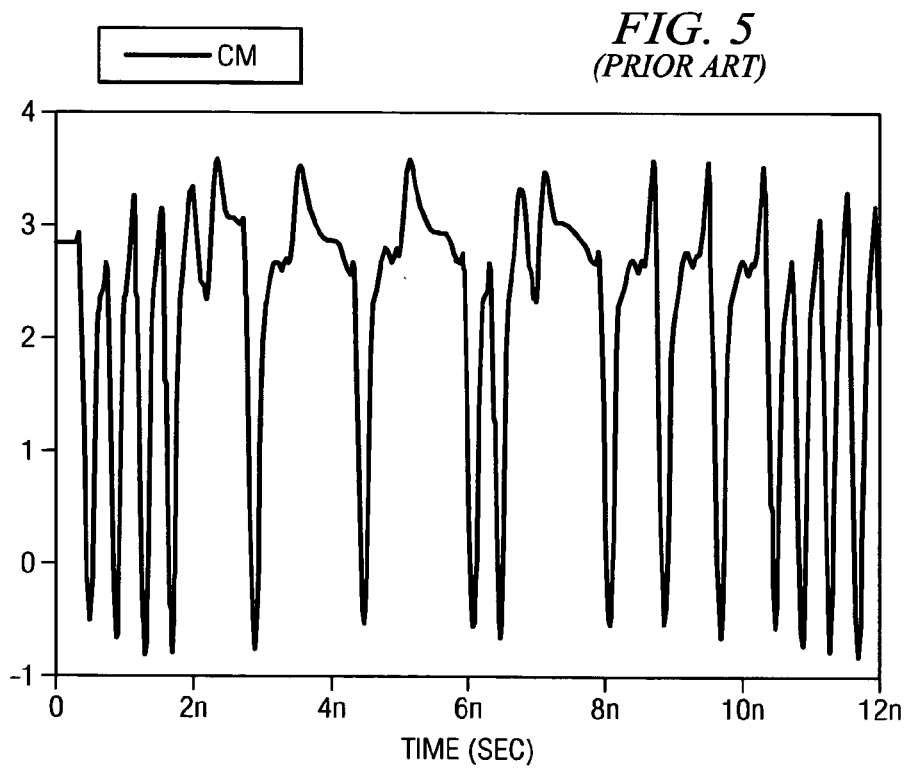
FIG. 5 illustrates the common mode voltage of a prior art head writer driver.

To better appreciate a noteworthy aspect of circuit 40, FIG. 4 illustrates a plot of the respective voltages HWX and HWY produced by circuit 40 at its nodes $N_1$ and $N_2$, respectively, in FIG. 2 and in an example of operation at 2.5 Gps. By way of general observation, note that the voltages HWX and HWY are substantially symmetric relative to one another, that is, relative to a constant voltage of ground and to a first approximation, over time, HWX=−HWY. This symmetric relationship is further illustrated by FIG. 4 in that it also depicts the common mode drive voltage between HWX and HWY, which as can be seen is a voltage that stays considerably close to zero volts. Also to appreciate circuit 40 and its voltages HWX and HWY, by way of contrast FIG. 5 illustrates the common mode voltage of a prior art head writer driver circuit that also provides differential outputs that drive the prior art write head (i.e., by inducing a write current in it). For the sake of comparison, the prior art plot of FIG. 5 also depicts an example of operation at 2.5 Gps. As is readily appreciated from FIG. 5, the write head common mode voltage in the prior art does not remain relatively stable near zero volts, as does that of the preferred embodiment as shown in FIG. 4. The effect of this difference is further explored below, and that effect pertains to resulting benefits as will be appreciated by one skilled in the art.

Figure 6:
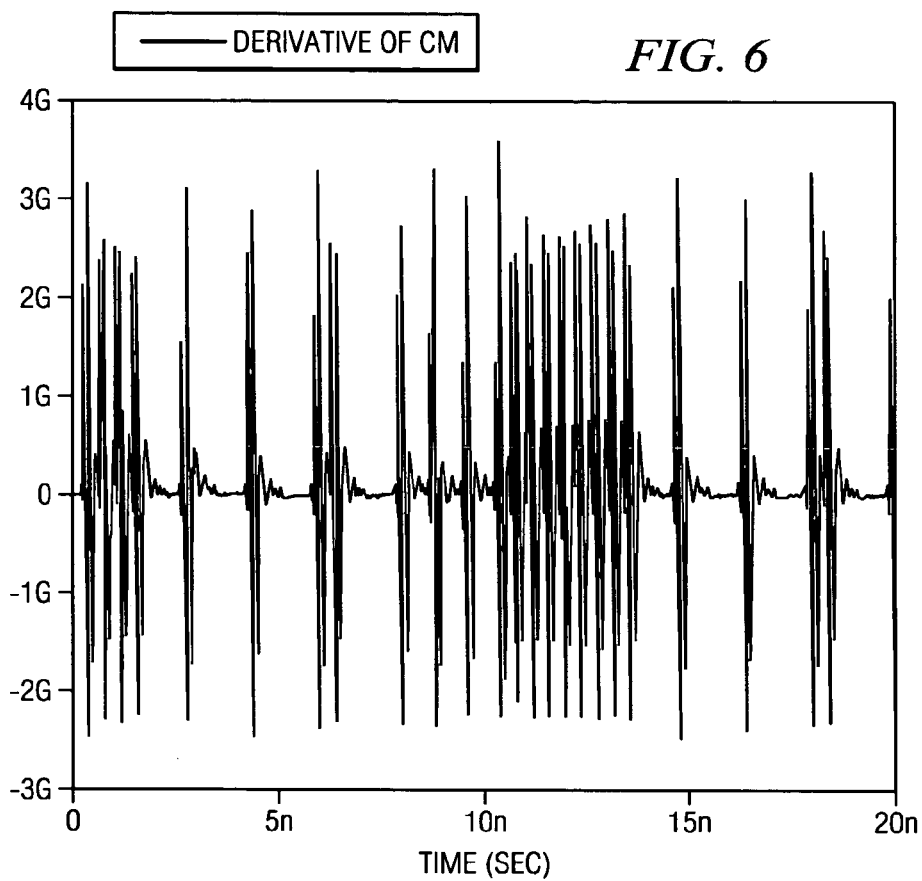
FIG. 6 illustrates a plot of the derivative of the common mode voltage of the preferred embodiment.
Figure 7:
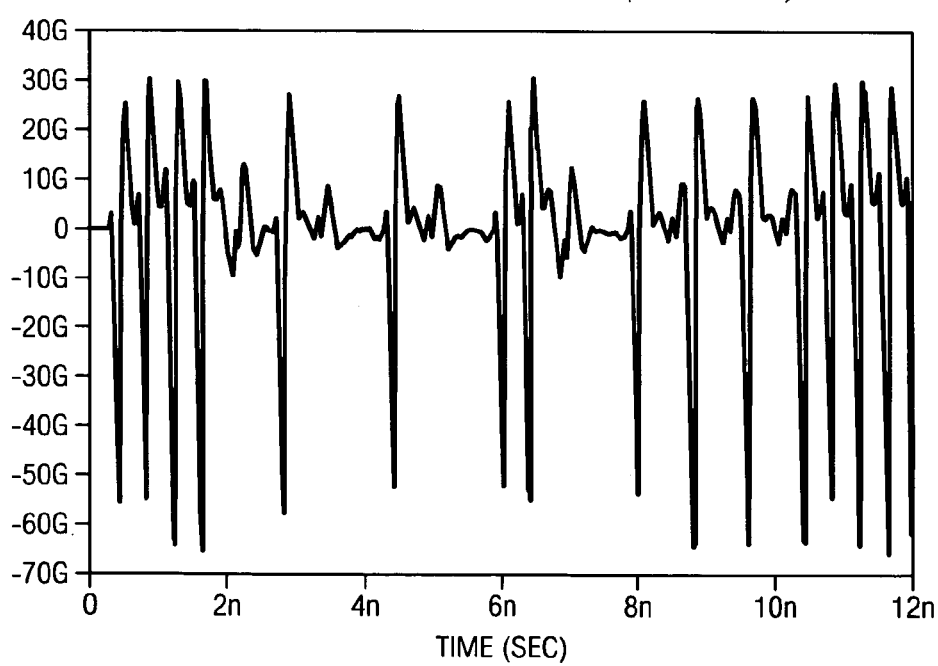
FIG. 7 illustrates a plot of the derivative of the common mode voltage of the prior art.

A noteworthy benefit of the preferred embodiments arises from the relatively small derivative of the common mode voltage as between the HWX and HWY voltages used to drive the write head. In this regard, FIG. 6 illustrates a plot of the derivative of the common mode voltage of the preferred embodiment as shown in FIG. 4 and, thus, FIG. 6 illustrates the change of that common voltage relative to time. By way of contrast, FIG. 7 illustrates a plot of the derivative of the prior art common mode drive voltage shown in FIG. 5. Attention is now directed to the considerable difference between these derivatives and the benefits provided in the preferred embodiments as a result of that difference. Specifically, with reference to FIG. 6, it may be seen that the maximum change in voltage over time is on the order of 3.5 Gvolts/sec and indeed there also are various periods of time where the derivative is considerably lower. Thus, it may be seen that for a drive voltage that has an approximately equal peak absolute value (i.e., looking at either the positive or negative peaks) of no more than approximately 3.4 volts and thus for a differential voltage of 6.8 volts as between the 3.4 volt peaks, the derivative of that voltage, as shown in FIG. 6, is approximately $10^9$/sec times that differential voltage. In contrast, with reference to the prior art of FIG. 7, it may be seen that the maximum change in voltage over time is on the order of 65 Gvolts/sec (absolute value). Moreover, this derivative arises from a drive voltage in the prior art between 5.0 volts and −1.4 volts, that is, for a differential voltage of 6.4 volts. Thus, the derivative of that prior art voltage is more than $10^{10}$/sec times the drive voltage. Quite clearly, therefore, the derivative of the writer drive common mode voltage of the preferred embodiments is considerably less than that of the prior art as there is an entire order of magnitude (i.e., $10^{-1}$) improvement.

With the above observations, attention is now directed to the effect of the reduced common mode voltage derivative of the preferred embodiments. Specifically, recall from the Background Of The Invention section of this document that the disk drive read head tracer is proximate to the write head tracer and, thus, the read head may be affected by magnetic coupling from the writer traces to the reader traces. This coupling is directly proportional to the rate of change in the signal induced in the write head. This rate of change, therefore, is the very derivatives shown in FIGS. 6 and 7. Thus, according to the prior art, where the common mode voltage rate of change is relatively large, then so is the coupling from the writer traces to the reader traces. As noted earlier, a large coupling presents a risk of damage to the nearby read head. In contrast, according to the preferred embodiments where the common mode voltage rate of change is relatively smaller, then there is reduced coupling from the writer traces to the reader traces. Consequently, there is a reduction in the chance of damage in the read head resulting from such coupling. Moreover, with the added safety margin brought about by the reduced magnetic coupling, there is the freedom to further advance the write speeds of the write head, which in the prior art would further increase the risk of damage beyond an acceptable threshold while under the preferred embodiments may still be safely achieved due to the reduced magnetic coupling. From the preceding, therefore, one skilled in the art should appreciate that in the preferred embodiments the derivative of the common mode voltage is reduced as compared to the prior art, where preferably the reduction is achieved by creating substantially symmetric voltage waveforms in the differential voltages, HWX and HWY, that are used to drive the write head inductor. Additional schematic details for achieving these various attributes are discussed below.

FIGS. 8A, 8B, 8C, and 8D collectively illustrate a schematic of various aspects of writer head assembly supply circuit 40 of FIG. 2. By way of introduction, certain items in FIGS. 8A through 8D are illustrated in more detail than others so as to describe various preferred matters while remaining aspects may be implemented by one skilled in the art. For example, in a preferred embodiment, circuit 40 and the write head it is a part of may be part of a device with multiple write heads. In this case, it may be desirable to enable only one write head at a time and, as such, each circuit 40 will also include one or more control signals and corresponding circuitry to disable the head that includes circuit 40 at appropriate times. As another example, in another preferred embodiment, various of the components may be implemented using various technologies, where one preferred approach is silicon-on-insulator ("SOI") technology. Lastly, note that various symmetry exists in FIGS. 8A through 8D and, thus, while certain details are provided, one skilled in the art will appreciate comparable connectivity within the circuit, as also described below.

Figure 8A:
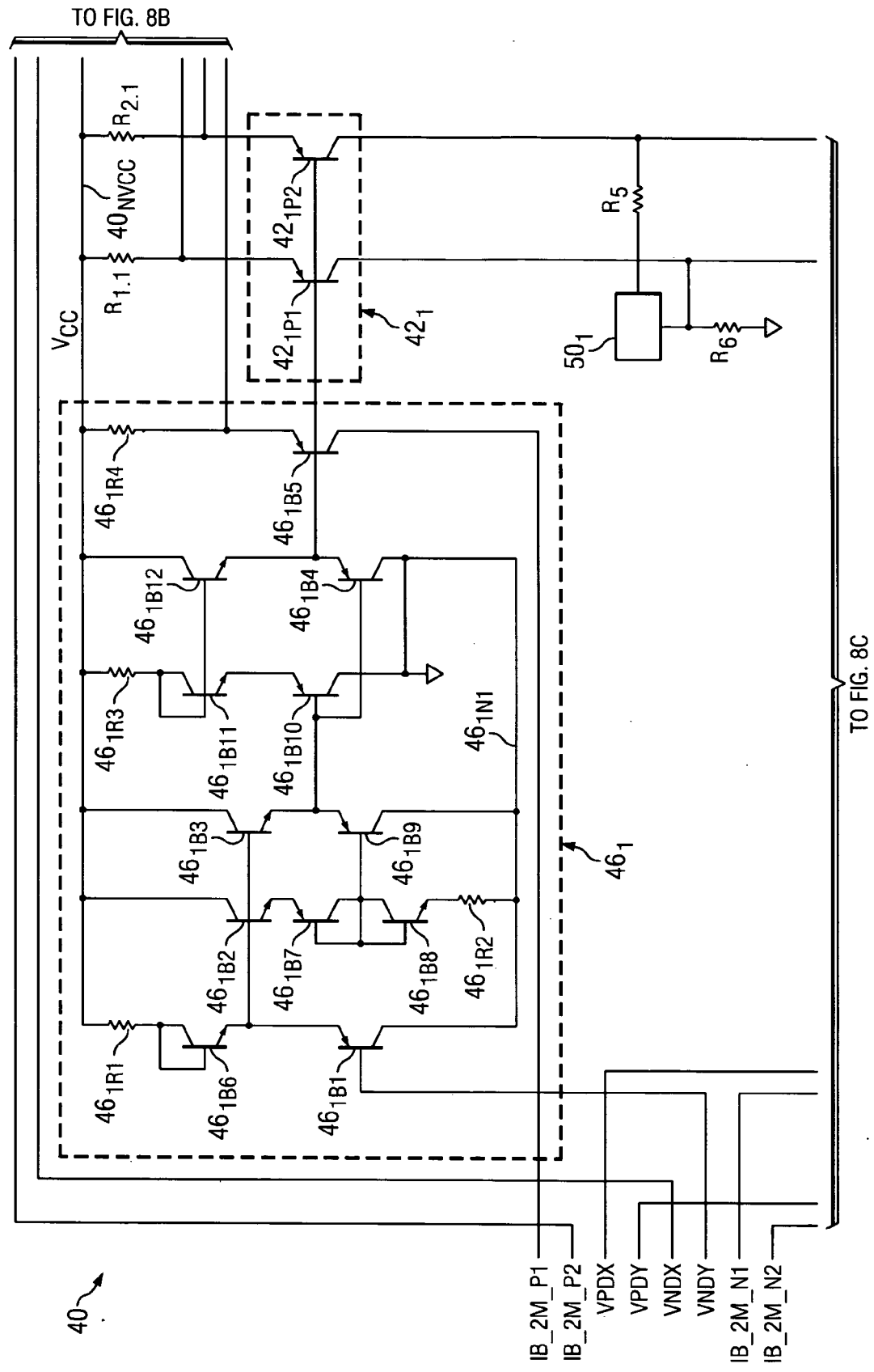
FIGS. 8A, 8B, 8C, and 8D collectively illustrate a schematic of various aspects of writer head assembly supply circuit 40 of FIG. 2.

Looking now to FIG. 8A, it illustrates various devices within pre-driver 46$_1$, shown as included within a dotted box. For sake of reference, these devices are each numbered with "46$_1$," yet added to the subscript is a letter for the device, such as B for a bipolar junction transistor (either PNP or NPN) or R for a resistor (or, in later figures, F for a field-effect transistor ("FET")). Recall from FIG. 2 that the signal VNDY is input to pre-driver 46$_1$ and ultimately causes a corresponding voltage signal at node $N_1$ (see FIG. 8C). With this appreciation, turning now to the schematic of pre-driver 46$_1$ in FIG. 8A, the following first traces the signal path of VNDY through BJT base-emitter junctions and to node $N_1$, and thereafter the additional devices in pre-driver 46$_1$ are described. VNDY is connected to the base of a PNP BJT 46$_{1B1}$. The signal continues via the emitter of PNP BJT 46$_{1B1}$ (and also to the base of an NPN BJT 46$_{1B2}$) to the base of an NPN BJT 46$_{1B3}$. Next, the signal continues from the emitter of NPN BJT 46$_{1B3}$ to the base of a PNP BJT 46$_{1B4}$. Next, the signal continues from the emitter of PNP BJT 46$_{1B4}$ (which is also connected to the base of a PNP BJT 46$_{1B5}$) and effectively is output from pre-driver 46$_1$ and then connects to the base of PNP BJT 42$_{1P1}$ and to the base of PNP BJT 42$_{1P2}$, which are described above with respect to FIG. 2.

Turning now to the additional connections with pre-driver 46$_1$ as shown in FIG. 8A, the collector of PNP BJT 46$_{1B1}$ is connected to a node 46$_{1N1}$ which is further connected to ground, and the emitter of PNP BJT 46$_{1B1}$ is connected to the emitter of a diode-connected NPN BJT 46$_{1B6}$, which has its base connected to its collector. The collector of NPN BJT 46$_{1B6}$ is also coupled through a resistor 46$_{1R1}$ to a node 40$_{NVCC}$, which is connected to receive the upper voltage supply, $V_{CC}$. The collector of NPN BJT 46$_{1B2}$ is connected to node 40$_{NVCC}$ and its emitter is connected to the emitter of a PNP BJT 46$_{1B7}$. The base and collector of PNP BJT 46$_{1B7}$ are connected to the base and collector of a NPN BJT 46$_{1B8}$, which has its emitter coupled through a resistor 46$_{1R2}$ to node 46$_{1N1}$. The bases and collectors of PNP BJT 46$_{1B7}$ and NPN BJT 46$_{1B8}$ are connected to the base of PNP BJT 46$_{1B9}$, which has its collector connected to node 46$_{1N1}$ and its emitter connected to the emitter of NPN BJT 46$_{1B3}$ and to the base of a PNP BJT 46$_{1B10}$ and to the base of PNP BJT 46$_{1B4}$. The emitter of PNP BJT 46$_{1B10}$ is connected to the emitter of a diode-connected NPN BJT 46$_{1B11}$, which has its base and collector coupled through a resistor 46$_{1R3}$ to node 40$_{NVCC}$. The collector of PNP BJT 46$_{1B10}$ is connected to node 46$_{1N1}$, which is also connected to the collector of PNP BJT 46$_{1B4}$. The base of NPN BJT 46$_{1B11}$ is also connected to the base of an NPN BJT 46$_{1B12}$, which has its collector connected to node 40$_{NVCC}$ and its emitter connected to the emitter of PNP BJT 46$_{1B4}$ and to the base of PNP BJT 46$_{1B5}$, as well as to the bases of PNP BJTs 42$_{1P1}$ and 42$_{1P2}$. Lastly, the emitter of PNP BJT 46$_{1B5}$ is coupled through a resistor 46$_{1R4}$ to node 40$_{NVCC}$, and the collector of PNP BJT 46$_{1B5}$ is connected to a biasing signal, IB_2M_P1.

Figure 8B:
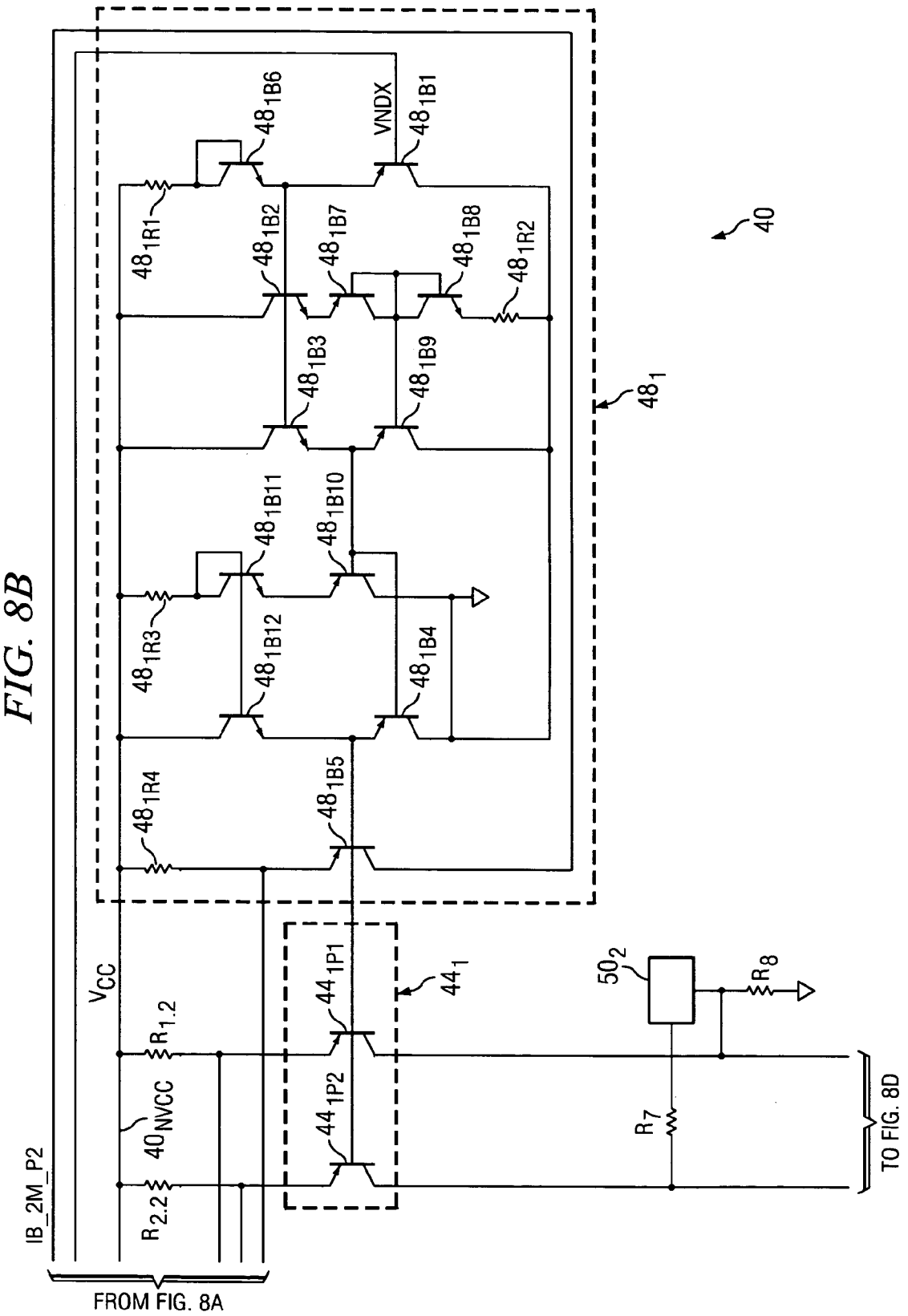
Figure 8C:
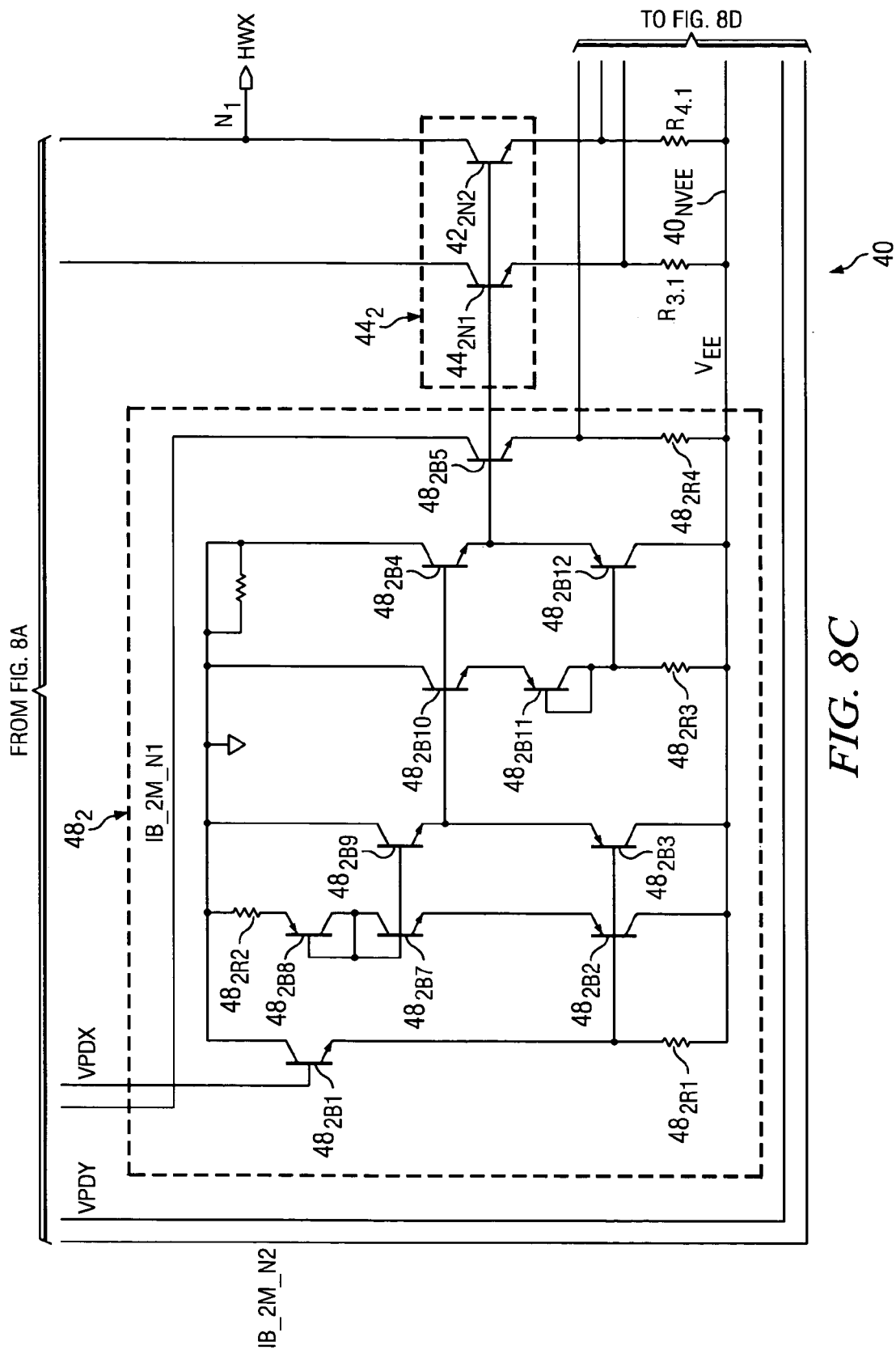

In FIG. 8A, the emitter of PNP BJT 46$_{1B4}$ may be considered the output of pre-driver 46$_1$ in the sense that it is further connected to the bases of PNP BJTs 42$_{1P1}$ and 42$_{1P2}$. Note that in a preferred embodiment, rather than using individual transistors 42$_{1P1}$ and 42$_{1P2}$, a different number of transistors may be used for each of these transistors, whereby each is connected in parallel, thereby having the bases of each transistor in such a group connected to one another and the collectors of each transistor in such a group connected to one another, with a resistance or resistances connected between the emitters of those transistors and node $40_{NVCC}$. For sake of simplicity and illustrating one approach, however, both FIG. 2 and FIGS. 8A and 8B illustrate only single BJTs in this regard. Moreover, opposite PNP BJTs $42_{1P1}$ and $42_{1P2}$ in FIG. 8A are PNP BJTs $44_{1P1}$ and $44_{1P2}$ in FIG. 8B. However, rather than a pair of these transistors sharing a single resistor between the emitters of the pair and $V_{CC}$ as in FIG. 2, in FIGS. 8A and 8B each such transistor in a pair has a single respective resistor connected between its emitter and node $40_{NVCC}$, for reasons such as better controlling heat and matching symmetric layout and operation within the circuit. More specifically in this regard, therefore, PNP BJT $42_{1P1}$ has a resistor $R_{1.1}$ connected between its emitter and node $40_{NVCC}$ and that emitter is also connected to the emitter of PNP BJT $44_{1P1}$ which has a resistor $R_{1.2}$ also connected between it and node $40_{NVCC}$; thus, resistors $R_{1.1}$ and $R_{1.2}$ form a single parallel resistance that corresponds to resistor $R_1$ shown in FIG. 2, where two actual resistors are preferred to achieve symmetry in the layout. Similarly, a single parallel resistance consisting of resistors $R_{21}$ and $R_{22}$ is connected between the connected emitters of PNP BJTs $42_{1P2}$ and $44_{1P2}$, again thereby providing symmetry in the layout.

Figure 8D:
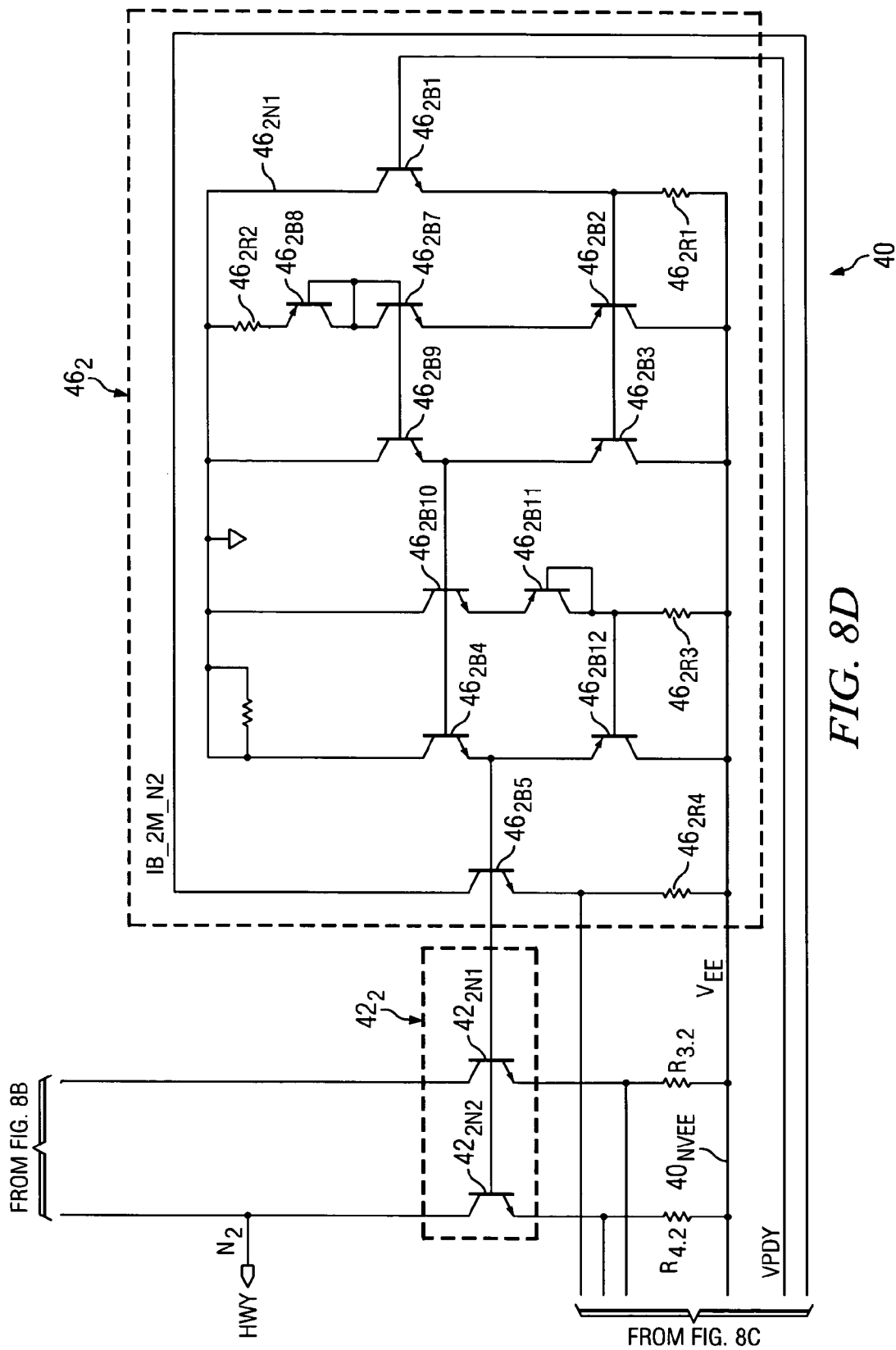

Turning now to driver $42_2$ and pre-driver $46_2$ in FIG. 8D, one skilled in the art will appreciate that, as introduced above with respect to FIG. 2, complementary BJTs are implemented which, as further detailed throughout this document, provides in part the symmetric voltage output and resulting beneficial small derivative of the common mode voltage as between the HWX and HWY voltages as detailed above. Looking first to driver $42_2$, it includes NPN BJTs $42_{2N1}$ and $42_{2N2}$ as shown in FIG. 2. In addition, however, and as now shown in detail, complementary BJTs are also included in pre-driver $46_2$ relative to pre-driver $46_1$. Further, these BJTs are connected in a manner that is symmetric with respect to pre-driver $46_2$ relative to pre-driver $46_1$. Turning to those devices specifically, the following first traces the signal path of VPDY through BJT base-emitter junctions to node $N_2$, and thereafter the additional devices in pre-driver $46_2$ are described. VPDY is connected to the base of an NPN BJT $46_{2B1}$; thus, for symmetry purposes, this BJT is seen to be symmetric, but complementary, of the PNP BJT $46_{1B1}$ in pre-driver $46_1$. Continuing then with the signal path of VPDY, it continues via the emitter of NPN BJT $46_{2B1}$ to the base of a PNP BJT $46_{2B3}$ (and to the base of a PNP BJT $46_{2B2}$). Next, the signal continues from the emitter of PNP BJT $46_{2B3}$ to the base of an NPN BJT $46_{2B4}$. Next, the signal continues from the emitter of NPN BJT $46_{2B4}$ to the bases of NPN BJTs $42_{2N1}$ and $42_{2N2}$ (and also to the base of an NPN BJT $46_{2B5}$). Thus, from the emitter of PNP BJT $46_{2B4}$, the signal effectively is output from pre-driver $46_2$ and then connects to the base of NPN BJT $42_{2N1}$ and to the base of NPN BJT $42_{2N2}$.

Turning now to the additional connections with pre-driver $46_2$ as shown in FIG. 8D, the collector of NPN BJT $46_{2B1}$ is connected to a node $46_{2N1}$ which is connected to ground, and the emitter of NPN BJT $46_{2B1}$ is coupled through a resistor $46_{2R1}$ to a node $40_{NVEE}$, which is connected to receive the lower voltage supply, $V_{EE}$. The collector of PNP BJT $46_{2B2}$ is connected to node $40_{NVEE}$ and its emitter is connected to the emitter of an NPN BJT $46_{2B7}$. The base and collector of NPN BJT $46_{2B7}$ are connected to the base and collector of a PNP BJT $46_{2B8}$, which has its emitter coupled through a resistor $46_{2R2}$ to node $46_{2N1}$. The base of NPN BJT $46_{2B7}$ is connected to the base of an NPN BJT $46_{2B9}$, which has its collector connected to node $46_{2N1}$ and its emitter connected to the emitter of PNP BJT $46_{2B3}$ as well as to the base of an NPN BJT $46_{2B10}$. The collector of PNP BJT $46_{2B3}$ is connected to node $40_{NVEE}$. The collector of NPN BJT $46_{2B10}$ is connected to node $46_{2N1}$ and its emitter is connected to the emitter of a diode-connected PNP BJT $46_{2B11}$, which has its base and collector connected to the base of a PNP BJT $46_{2B12}$ and also coupled through a resistor $46_{2R3}$ to node $40_{NVEE}$. The collector of PNP BJT $46_{2B12}$ is connected to node $40_{NVEE}$ and its emitter is connected to the emitter of NPN BJT $46_{2B4}$ and to the base of NPN BJT $46_{2B5}$, which recall is connected to the bases of NPN BJT $42_{2N1}$ and $42_{2N2}$. The collector of NPN BJT $46_{2B4}$ is connected to node $46_{2N1}$. The emitter of NPN BJT $46_{2B5}$ is coupled through a resistor $46_{2R4}$ to node $40_{NVEE}$ and the collector of NPN BJT $46_{2B5}$ is connected to a biasing signal, IB_2M_N2.

Having detailed the connectivity in pre-drivers $46_1$ and $46_2$, the operation of those circuits is now described, where as detailed above those two pre-drivers are enabled at a same time so that driver $42_1$ sources current while driver $42_2$ sinks current, all for providing waveforms to the disk write head (not shown) located between nodes $N_1$ and $N_2$. Further, with generally symmetric connectivity between pre-drivers $46_1$ and $46_2$, the following operational discussion is directed to pre-driver $46_1$ since one skilled in the art will readily appreciate the comparable operation in pre-driver $46_2$, albeit with complementary BJT devices. In general, pre-driver $46_1$ operates using what may be described as three stages to step up current (and ultimately to provide a waveform HWX at node $N_1$). The first stage includes PNP BJT $46_{1B1}$ which is connected as an emitter follower, with a voltage drop provided by the diode-connected NPN BJT $46_{1B6}$. Additionally, in order to provide a relatively fast signal transition, the resistance of resistor $46_{1R1}$ may be kept relatively small. Thus, the emitter of PNP BJT $46_{1B1}$ provides an output of this first stage to a second stage, which includes NPN BJT $46_{1B2}$, as well as PNP BJT $46_{1B7}$ and NPN BJT $46_{1B8}$, which are passive loads in combination with resistor $46_{1R2}$. Also in this second stage, NPN BJT $46_{1B3}$ and PNP BJT $46_{1B9}$ provide a push-pull operation such that NPN BJT $46_{1B3}$ can source current and PNP BJT $46_{1B9}$ can sink current, and thereby output a signal out of the second stage and, hence, into the third stage. In the third stage, NPN BJT $46_{1B11}$ and PNP $46_{1B10}$ are effectively a mini-pre-driver for NPN BJT $46_{1B12}$ and PNP BJT $46_{1B5}$, which are preferably larger BJTs than the others in the first and second stages and thereby provide a robust drive signal to driver $42_1$. In this capacity, NPN BJT $46_{1B12}$ sources current and PNP BJT $46_{1B4}$ sinks current, with a resulting signal provided to the base of PNP BJTs $42_{1P1}$ and $42_{1P2}$ of driver $42_1$. As a result, the voltage HWX is provided at node $N_1$ from the collector of PNP BJT $42_{1P2}$. Moreover, at the same time and using nearly symmetrical operation but with complementary devices in pre-driver $46_2$, NPN BJT $46_{2B4}$ sources current and PNP BJT $46_{2B12}$ sinks current, with a resulting signal provided to the base of NPN BJTs $42_{2N1}$ and $42_{2N2}$ of driver $42_2$ with a resulting voltage HWY provided at node $N_2$ from the collector of NPN BJT $42_{2N2}$.

Having described the connectivity and operation of pre-drivers $46_1$ and $46_2$, one skilled in the art will appreciate the comparable connectivity and operation of pre-drivers $48_1$ and $48_2$. Thus, a comparable level of detail is not necessary herein. Instead, it may be appreciated that pre-driver $48_1$ represents a mirror image with respect to pre-driver $46_1$. Briefly, therefore, looking to pre-driver $48_1$, the base-emitter signal path for biasing signal VNDX begins at the base of a PNP BJT $48_{1B1}$, increases by a $V_{BE}$ from there to the base of an NPN BJT $48_{1B3}$, and then decreases there by a $V_{BE}$ to the base of a PNP BJT $48_{1B4}$. From the base of PNP BJT $48_{1B4}$, the signal increases a $V_{BE}$ to the bases of PNP BJTs $44_{1P1}$ and $44_{1P2}$ (and PNP BJT $48_{1B5}$). The remaining devices within pre-driver $48_1$ are readily seen to have counterpart devices and connections in pre-driver $46_1$ and, indeed, like subscripts are used in pre-drivers $46_1$ and $48_1$ to demonstrate the correspondence between such elements. Similarly pre-driver $48_2$ represents a mirror image with respect to pre-driver $46_2$ and again like subscripts are used in pre-drivers $46_2$ and $48_2$ to demonstrate the correspondence between such elements. Briefly, therefore, looking to pre-driver $48_2$, the base-emitter signal path for biasing signal VPDX begins at the base of an NPN BJT $48_{2B1}$, decreases by a $V_{BE}$ from there to the base of a PNP BJT $48_{2B3}$, and then increases there by a $V_{BE}$ to the base of an NPN BJT $48_{2B4}$. From the base of NPN BJT $48_{2B4}$, the signal decreases a $V_{BE}$ to the gates of NPN BJTs $44_{2N1}$ and $44_{2N2}$ (and NPN BJT $48_{2B5}$). The remaining devices and connectivity within pre-driver $48_2$ are readily appreciated by one skilled in the art.

With supply circuit 40 of FIGS. 8A through 8D operating primarily in response to the biasing signals VPDX, VPDY, VNDX, and VNDY, attention is now directed to FIGS. 9A, 9B, 9C, 9D, and 9E, which collectively include a circuit 100 for generating, among other things, those biasing signals. By way of introduction, while FIGS. 9A through 9E illustrate numerous details with respect to circuit 100, as in the case with circuit 40 of FIGS. 8A through 8D, certain aspects also are not shown so as to focus the discussion on various preferred aspects. In addition to the examples, therefore, provided earlier for circuit 40 of FIGS. 8A through 8D, note with respect to FIGS. 9A through 9E that certain components shown individually may be replaced with multiple components, such as using parallel resistors for a given resistor or parallel capacitors for a given capacitor. Still other examples will be ascertainable by one skilled in the art.

Turning now to the specific details illustrated in FIGS. 9A through 9E, in the preferred embodiment, a current, IW (see FIG. 9D), is provided by a precision current source, such as is provided or controlled by a digital-to-analog converter, and current IW is connected to a node $102_N$. Node $102_N$ is connected to a current mirror 104 that includes various devices, one of which is an NPN BJT $104_{B1}$ having its collector connected to node $102_N$ and its emitter coupled through a resistor $104_{R1}$ to a node $10_{NVEE}$, which is connected to receive supply voltage $V_{EE}$. The base of NPN BJT $104_{B1}$ is connected to the base of an NPN BJT $104_{B2}$, which in its mirrored configuration has its emitter coupled through a resistor $104_{R2}$ to node $100_{NVEE}$; to mirror the current upward in the sense of the layout of FIG. 9D, the collector of NPN BJT $104_{B2}$ is connected through three diode-connected NPN BJTs $104_{B3}$, $104_{B4}$, and $104_{B5}$ (i.e., each with a respective base-collector connection), and finally to the emitter of an NPN BJT $104_{B6}$, which has its base connected to a grounded node $106_{NG}$ (see FIG. 9A) and its collector connected to a node $108_N$ (also see FIG. 9A).

Figure 9A:
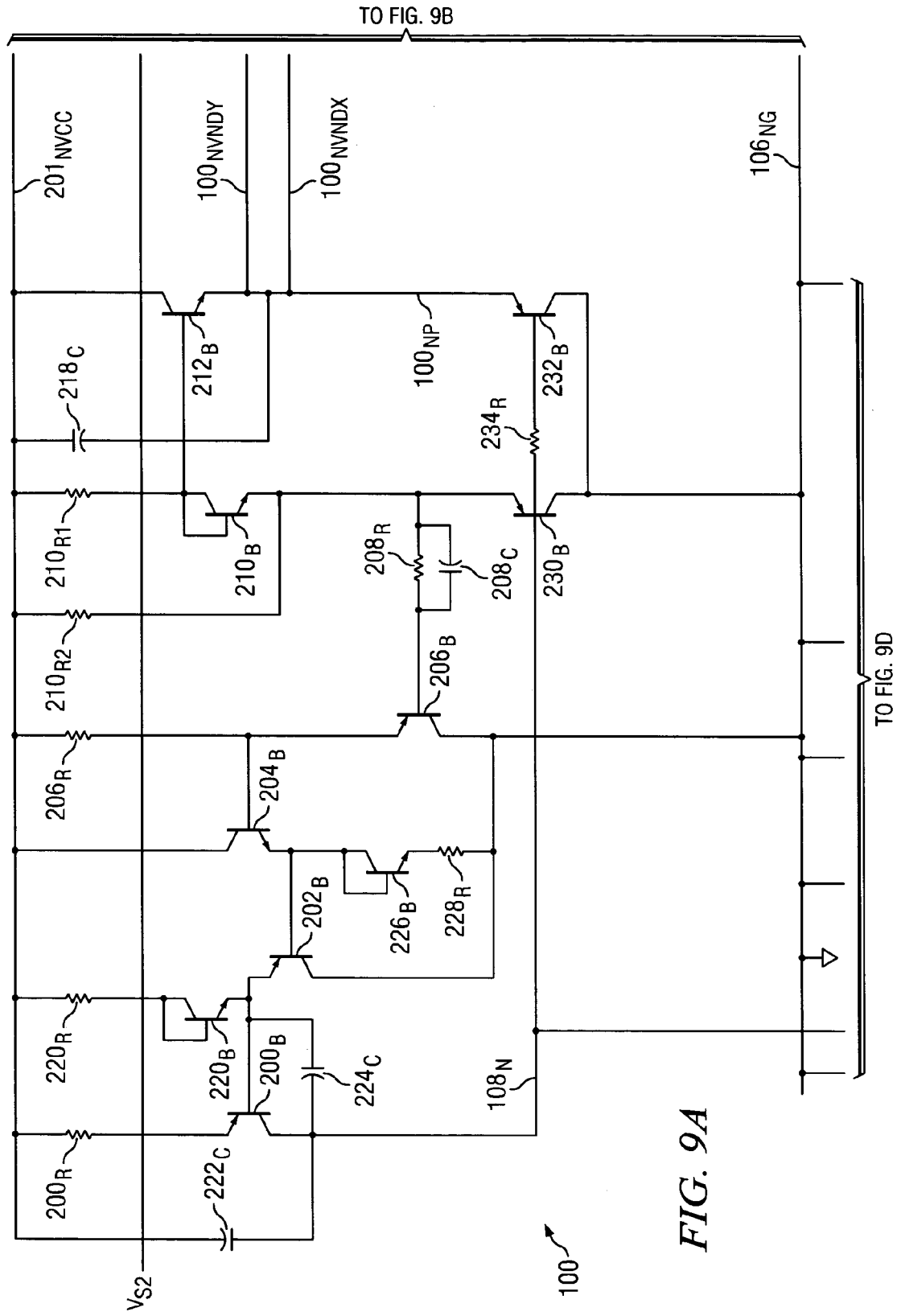
FIGS. 9A, 9B, 9C, 9D, and 9E collectively illustrate a pre-driver circuit for generating the biasing signals VNDY, VNDX, VPDY, and VPDX.

Returning to FIG. 9D, a signal path is traced so as to facilitate a later discussion of the generation of biasing voltages VPDX and VPDY. Particularly, the current, IW, provided at node $102_N$ causes a corresponding current at the emitter of NPN BJT $104_{B1}$, and that current therefore causes a voltage across resistor $104_{R1}$, measured from a node $104_{N1}$ with respect to node $100_{NVEE}$. The voltage at node $104_{N1}$ is then increased by the base-emitter voltage ("$V_{BE}$") of NPN BJT $104_{B1}$ and is connected to the emitter of NPN BJT $110_B$ (as well as to the base of NPN BJT $104_{B2}$). From the emitter of NPN BJT $110_B$, which is also connected to the emitter of a diode-connected PNP BJT $113_B$ that has its base and collector coupled through a resistor $113_R$ to node $100_{NVEE}$, the voltage increases a $V_{BE}$ to the base of NPN BJT $110_B$, and it is then connected to the emitter of a PNP BJT $114_B$, which has the current through it controlled by coupling its emitter to node $106_{NG}$ via a diode-connected PNP BJT $116_B$ and a resistor $116_R$. The voltage at the emitter of a PNP BJT $114_B$ then drops a $V_{BE}$ from that emitter to the base of PNP BJT $114_B$, from where it is connected to the emitter of an NPN BJT $118_B$, where that NPN BJT $118_B$ has its collector connected to node $106_{NG}$ (see FIG. 9A) and its emitter coupled through a resistor, $119_R$, to node $100_{NVEE}$. The voltage at the emitter of a NPN BJT $118_B$ increases a $V_{BE}$ from that emitter to the base of NPN BJT $118_B$, from where it is stabilized by a combination of two NPN BJTs $120_{B1}$ and $122_{B1}$, each acting as a class AB follower in connection with a respective PNP BJT $120_{B2}$ and $122_{B2}$ connected such that the emitters of each such pair are connected, with the collector and base of PNP BJT $120_{B2}$ coupled through a resistor $120_R$ to node $100_{NVEE}$, the collector of PNP BJT $122_{B2}$ connected directly to node $100_{NVEE}$, and the emitter of PNP BJT $122_{B2}$ also coupled through a resistor $123_R$ to node $100_{NVEE}$. The bases of PNP BJTs $120_{B1}$ and $122_{B1}$ are separated by a resistor $124_R$ and the base of PNP BJT $120_{B1}$ is also connected to node $102_N$, while the collectors of these two BJTs are connected to node $106_{NG}$ (FIG. 9A). The emitter of NPN BJT $120_{B1}$ is coupled through a resistor $126_R$ to node $100_{NVEE}$. Additionally, the voltage at the emitters of NPN BJT $122_{B1}$ and PNP BJT $122_{B2}$ is therefore at a node $100_{NN}$, and it is connected through a resistor $130_{R1}$ to a node $100_{NVPDX}$ that provides the voltage VPDX, where as seen later this voltage may be influenced further by being pulled toward $V_{EE}$ or supplemented with an overshoot voltage. Similarly that same voltage at node $100_{NN}$ from the emitters of NPN BJT $122_{B1}$ and NPN BJT $122_{B2}$ is connected through a resistor $130_{R2}$ to a node $100_{NVPDY}$ that provides the voltage VPDY, where as also seen later this voltage may be influenced further by being pulled toward $V_{EE}$ or supplemented with an overshoot voltage. Thus, node $100_{NN}$ may be driven in both directions and is provided as a very low impedance node.

Also in connection with the later discussion of the generation of biasing voltages VPDX and VPDY and with respect to FIGS. 9A-E, circuit 100 includes a switch $S_P$ and a pulse circuit $P_P$ (see FIG. 9B), where the subscript of "P" in each item is intended to associate them with the "VP" signals VPDX and VPDY, as opposed to the VN signal VNDX and VNDY, discussed later. Each of these items is detailed below.

Figure 9B:
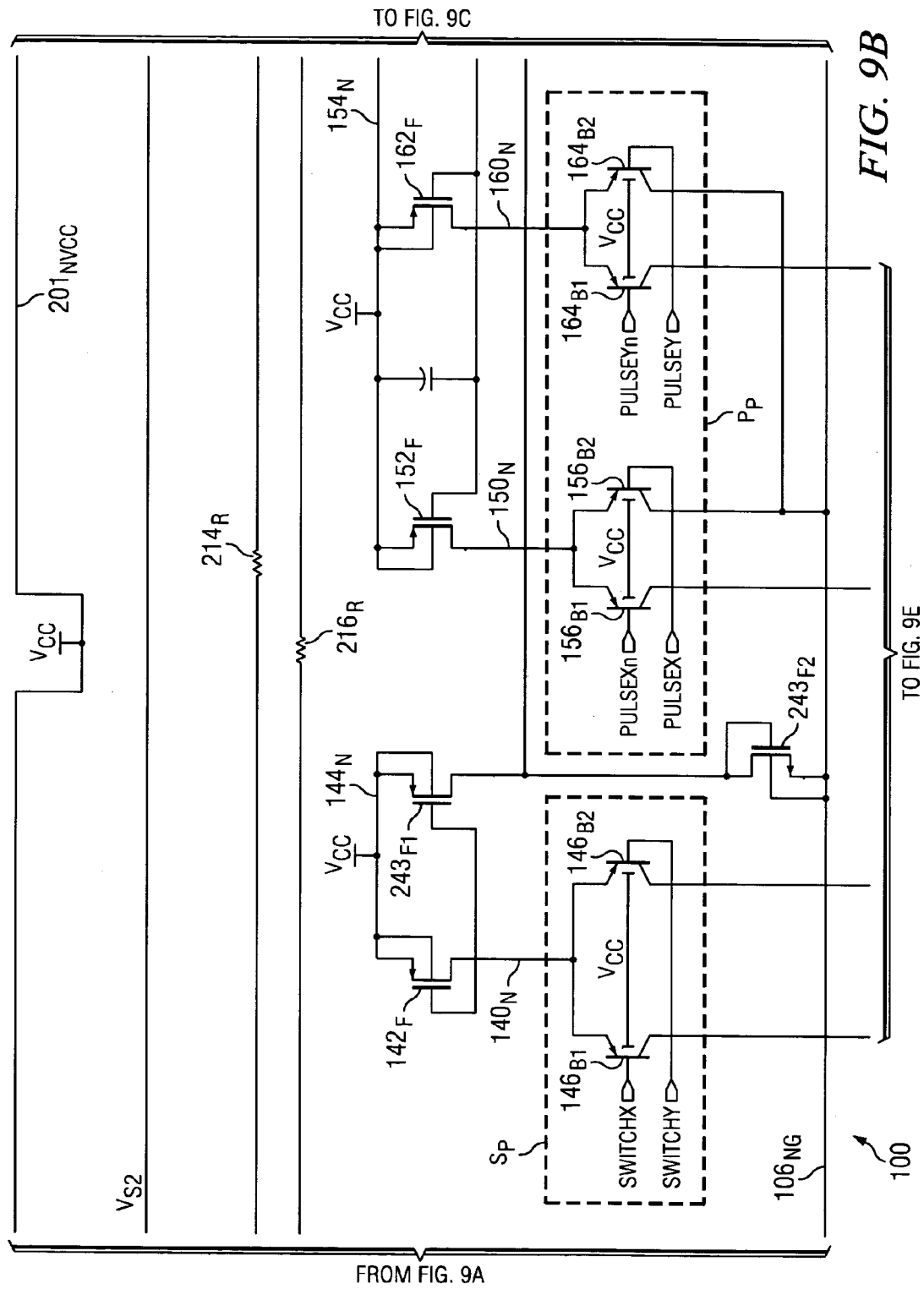

Looking to switch $S_P$ and its related connections in FIG. 9B, switch $S_P$ includes a node $140_N$ connected through the source/drain path of an FET $142_F$ to a node $144_N$, which is connected to receive the supply voltage $V_{CC}$. Within switch $S_P$, node $140_N$ is also connected to the emitter of each of PNP BJTs $146_{B1}$ and $146_{B2}$. The base of PNP BJT $146_{B1}$ receives a control signal SWITCHX and its collector is coupled through a resistor $146_{R1}$ (FIG. 9E) to node $100_{NVEE}$. The base of PNP BJT $146_{B2}$ receives a control signal SWITCHY and its collector is coupled through a resistor $146_{R2}$ (FIG. 9E) to node $100_{NVEE}$. Resistor $146_{R1}$ also couples the emitter of an NPN BJT $148_{8B1}$ to node $100_{NVEE}$, while the base of NPN BJT $148_{B1}$ is connected to a constant voltage source $V_{S1}$ that keeps NPN BJT $148_{B1}$ in a proper operating range and its collector is connected to node $100_{NVPDY}$. Resistor $146_{R2}$ also connects the emitter of an NPN BJT $148_{B2}$ to node $100_{NVEE}$, while the base of NPN BJT $148_{B2}$ is also connected to $V_{S1}$ and its collector is connected to node $100_{NVPDX}$.

Looking to pulse circuit $P_P$ and its related connections, pulse circuit $P_P$ includes a node $150_N$ coupled through the source/drain path of an FET $152_F$ to a node $154_N$. Within pulse circuit $P_P$, node $150_N$ is also connected to the emitter of each of PNP BJTs $156_{B1}$ and $156_{B2}$. The base of PNP BJT $156_{B1}$ receives a control signal PULSEXn and its collector is connected to node $100_{NVPDX}$ (FIG. 9E). The base of PNP BJT $156_{B2}$ receives a control signal PULSEX and its collector is connected to node $106_{NG}$. Pulse circuit $P_P$ also includes a node $160_N$ coupled through the source/drain path of an FET $162_F$ to node $154_N$. The gate of FET $162_F$ is connected to the gate of FET $152_F$, and those gates are also connected to both the gate and drain of an FET $164_F$ (FIG. 9C) having its source connected to node $154_N$, where the gates of all three of those FETs are further connected to receive a signal IOS such that current is mirrored through those devices. Returning to node $160_N$, it is also connected to the emitter of each of PNP BJTs $164_{B1}$ and $164_{B2}$. The base of PNP BJT $164_{B1}$ receives a control signal PULSEYn and its collector is connected to node $100_{NVPDY}$. The base of PNP BJT $164_{B2}$ receives a control signal PULSEY and its collector is connected to node $106_{NG}$.

Having described various circuitry and connectivity to provide the VPDX and VPDY biasing signals, attention is now directed to FIGS. 9A-E circuitry, which is comparable in many respects to the preceding, but that provides the VNDX and VNDY signals. Recalling that a current is mirrored to node $108_N$ in FIG. 9A, the following first examines the signal path from that node and toward the VNDX and VNDY signals. Node $108_N$ is connected to the collector of a PNP BJT $200_B$, which has its emitter coupled through a resistor $200_R$ to a node $201_{NVCC}$, which is connected to $V_{CC}$. The base of PNP BJT $200_B$ connected to the emitter of a PNP BJT $202_B$ and, thus, a $V_{BE}$ drops occurs across that device to its base. The collector of PNP BJT $202_B$ is connected to node $106_{NG}$ and the base of that transistor is connected to the emitter of an NPN BJT $204_B$, which has its collector connected to node $201_{NVCC}$. Thus, the signal increases by a $V_{BE}$ and then is connected to the emitter of a PNP BJT $206_B$, which has its emitter also coupled through a resistor $206_R$ to node $201_{NVCC}$ and its base coupled, through a parallel connection of a resistor $208_R$ and a capacitor $208_C$, to increase a $V_{BE}$ by connecting to the emitter of a diode-connected NPN BJT $210_B$ having its base and collector connected together. The emitter of NPN BJT $210_B$ is coupled through a resistor $210_{R2}$ to $V_{CC}$ and the base and collector of NPN BJT $210_B$ is coupled through a resistor $210_{R1}$ to node $201_{NVCC}$; further, that base and collector are also connected to the base of an NPN BJT $212_B$. Thus, the signal at the base of NPN BJT $212_B$ drops one $V_{BE}$ to a node $100_{NP}$. Additionally, the emitter of NPN BJT $212_B$ is coupled through a capacitor $218_C$ (or multiple parallel capacitors) to node $201_{NVCC}$.

Looking at some additional devices coupled to the various devices of the signal path described immediately above, the base of PNP BJT $200_B$ is connected to the emitter of a diode-connected NPN BJT $220_B$, having its base connected to its collector, and that base and collector are coupled through a resistor $220_R$ to node $201_{NVCC}$. A capacitor $222_C$ is connected from node $201_{NVCC}$ to the collector of PNP BJT $200_B$, and a capacitor $224_C$ is connected from the collector of PNP BJT $200_B$ to the base of that same BJT. The emitter of NPN BJT $204_B$ is connected to the collector of a diode-connected NPN BJT $226_B$, having its collector connected to its base and its emitter coupled through a resistor $228_R$ to node $106_{NG}$. The emitter of NPN BJT $210_B$ is connected to the emitter of a PNP BJT $230_B$ that has its base connected to node $108_N$ and its collector connected to both node $106_{NG}$ and to the collector of a PNP BJT $232_B$, which has its base coupled through a resistor $234_R$ to node $108_N$ and its emitter connected to the emitter of NPN BJT $212_B$. Additionally, the voltage at the emitters of NPN BJT $212_B$ and PNP BJT $232_B$ is therefore at node $100_{NP}$, and it is connected through a resistor $214_R$ (FIG. 9B) to a node $100_{NVNDY}$ that provides the voltage VNDY. As seen later, this voltage VNDY may be influenced further by being pulled toward $V_{CC}$ or pulled downward with an overshoot voltage. Similarly that same voltage in FIG. 9A at node $100_{NP}$ from the emitters of NPN BJT $212_B$ and PNP BJT $232_B$ is coupled through a resistor $216_R$ (FIG. 9B) to a node $100_{NVNDX}$ that provides the biasing voltage VNDX. As also seen later, this biasing voltage VNDX may be influenced further by being pulled toward $V_{EE}$ or supplemented with an overshoot voltage.

Also in connection with the later discussion of the generation of biasing voltages VNDX and VNDY and with respect to FIG. 9C, circuit 100 includes a switch $S_N$ and a pulse circuit $P_N$, where the subscript of "N" in each item is intended to associate them with the "VN" signals VNDX and VNDY, as opposed to the VP signal VPDX and VPDY, discussed later. Each of these "VN" related items is detailed below.

Figure 9C:
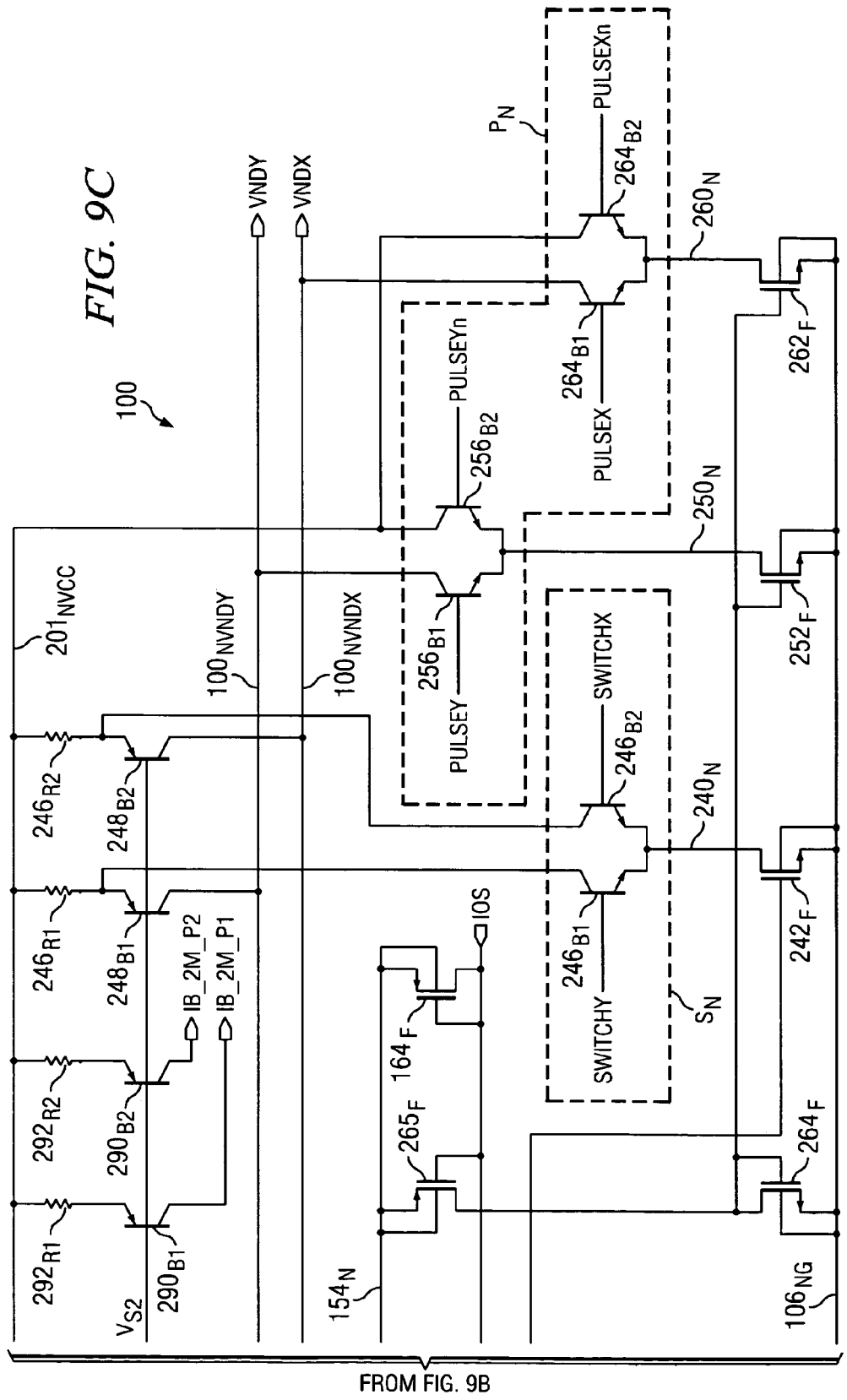
Figure 9D:
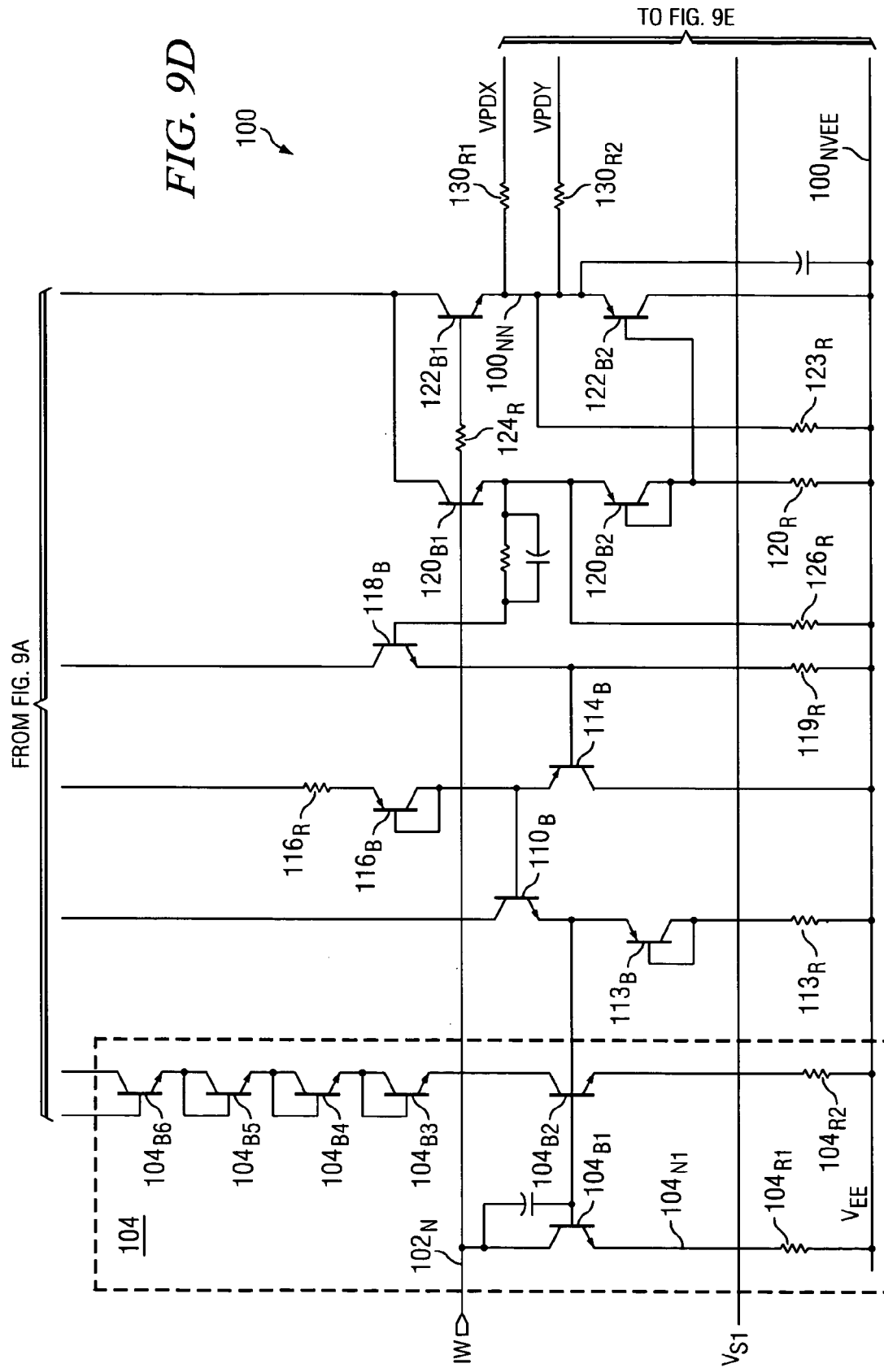
Figure 9E:
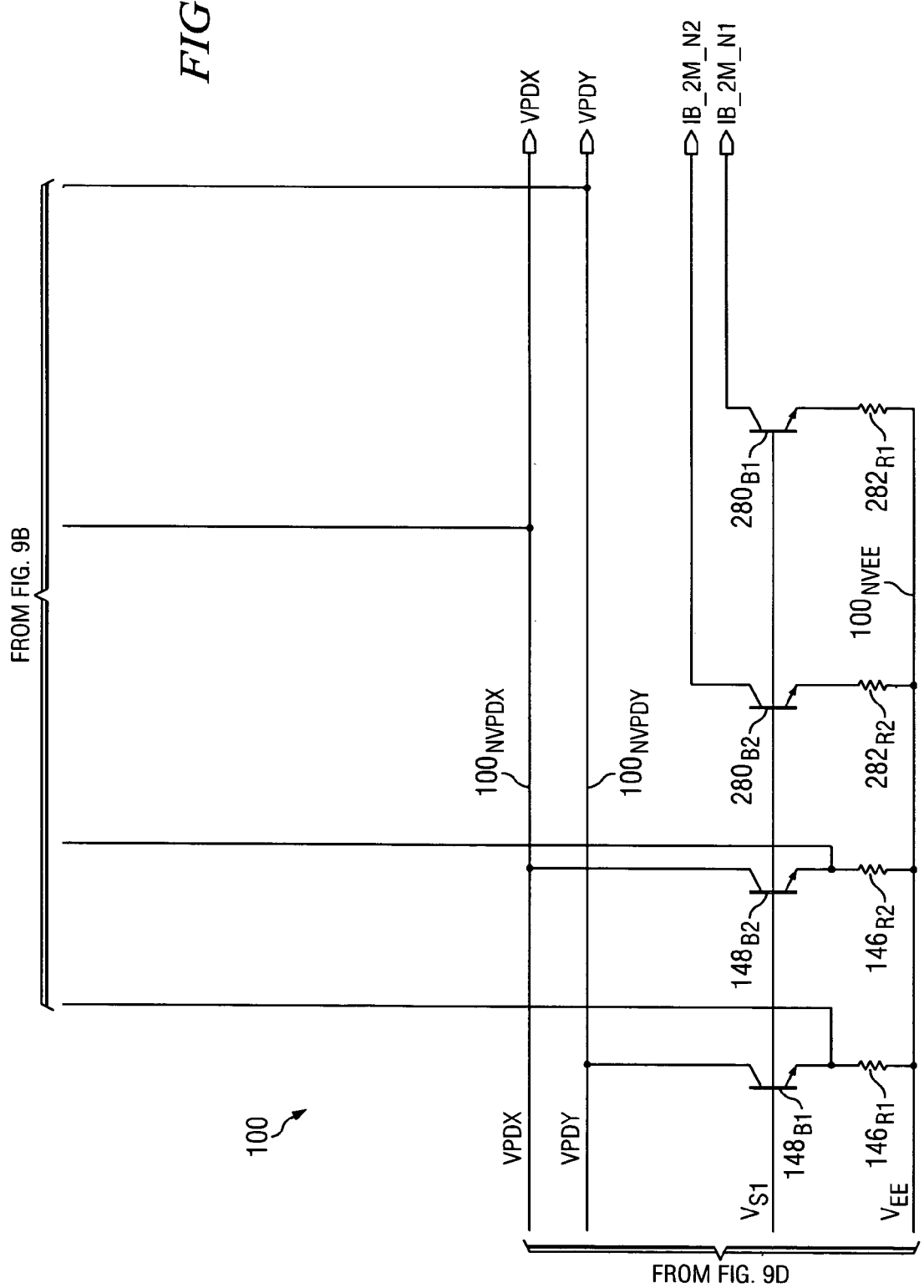

Looking to switch $S_N$ and its related connections in FIG. 9C, switch $S_N$ includes a node $240_N$ coupled through the source/drain path of an FET $242_F$ to node $106_{NG}$, which recall is connected to ground. FET $242_F$ has its gate connected to the drain of an FET $243_{F1}$ (FIG. 9B) and an FET $243_{F2}$, where the source of FET $243_{F1}$ is connected to $V_{CC}$ and the gate of FET $243_{F1}$ is connected to the gate of FET $142_F$, while the source of FET $243_{F2}$ is connected to node $106_{NG}$ and its gate is connected to its drain. Within switch $S_N$ of FIG. 9C, node $240_N$ is also connected to the emitter of each of NPN BJTs $246_{B1}$ and $246_{B2}$. The base of NPN BJT $246_{B1}$ receives a control signal SWITCHY and its collector is coupled through a resistor $246_{R1}$ to node $201_{NVCC}$. The base of NPN BJT $246_{B2}$ receives a control signal SWITCHX and its collector is coupled through a resistor $246_{R2}$ to node $201_{NVCC}$. Resistor $246_{R1}$ also couples the emitter of a PNP BJT $248_{B1}$ to node $201_{NVCC}$, while the collector of PNP BJT $248_{B1}$ is connected to node $100_{NVNDY}$, and the base of PNP BJT $248_{B1}$ is connected to a constant voltage source $V_{S2}$ that keeps PNP BJT $248_{B1}$ (and other transistors) in a proper operating range. Resistor $246_{R2}$ also couples the emitter of a PNP BJT $248_{B2}$ to node $201_{NVCC}$, while the base of PNP BJT $248_{B2}$ is also connected to $V_{S2}$ and its collector is connected to node $100_{NVNDX}$.

Looking to pulse circuit $P_N$ in FIG. 9C and its related connections, pulse circuit $P_N$ includes a node $250_N$ coupled through the source/drain path of an FET $252_F$ to node $106_{NG}$. Within pulse circuit $P_N$, node $250_N$ is also connected to the emitter of each of NPN BJTs $256_{B1}$ and $256_{B2}$. The base of PNP BJT $256_{B1}$ receives the control signal PULSEY and its collector is connected to node $100_{NVNDY}$. The base of PNP BJT $256_{B2}$ receives a control signal PULSEYn and its collector is connected to node $201_{NVCC}$. Pulse circuit $P_N$ also includes a node $260_N$ coupled through the source/drain path of an FET $262_F$ to node $106_{NG}$. The gate of FET $262_F$ is connected to the gate of FET $252_F$, and those gates are also connected to both the gate and drain of an FET $264_F$, having its source connected to node $106_{NG}$ and its drain further connected to the drain of an FET $265_F$, which has its source connected to node $154_N$ and its gate connected to the gates of FETs $152_F$, $162_F$, and $164_F$; such that a current mirror is created with respect thereto. Returning to node $260_N$, it is also connected to the emitter of each of NPN BJTs $264_{B1}$ and $264_{B2}$. The base of PNP BJT $264_{B1}$ receives a control signal PULSEX and its collector is connected to node $100_{NVNDX}$. The base of PNP BJT $264_{B2}$ receives a control signal PULSEXn and its collector is connected to node $201_{NVCC}$.

Completing FIGS. 9A-E, also included are a few devices for purposes of providing biasing signals, IB_2M_N1, IB_2M_N2, IB_2M_P1, and IB_M_P2, all of which are provided to circuit 40 of FIGS. 8A-D. Looking to the first two of those signals IB_2M_N1 and IB_2M_N2 and FIG. 9E, they are produced at the respective collectors of NPN BJTs $280_{B1}$ and $280_{B2}$. The emitter of each of NPN BJTs $280_{B1}$ and $280_{B2}$ is coupled through a respective resistor, $282_{R1}$ and $282_{R2}$, to node $100_{NVEE}$. The respective bases of NPN BJTs $280_{B1}$ and $280_{B2}$ are connected to the constant voltage source $V_{S1}$. Looking to the signals IB_2M_P1 and IB_2M_P2 and FIG. 9C, they are produced at the respective collectors of PNP BJTs $290_{B1}$ and $290_{B2}$. The emitter of each of PNP BJTs $290_{B1}$ and $290_{B2}$ is coupled through a respective resistor, $292_{R1}$ and $292_{R2}$, to node $201_{NVCC}$. The respective bases of PNP BJTs $290_{B1}$ and $290_{B2}$ are connected to the constant voltage source $V_{S2}$.

The operation of circuit 100 of FIGS. 9A-E is now discussed. By way of introduction, circuit 100 produces as outputs the biasing signals VPDX, VNDX, VPDY, and VNDY as smaller scale versions of the signals ultimately output as signals HWX and HWY in FIGS. 8A-D, and as also shown in FIG. 4, all of which are discussed earlier. In this regard, the current IW causes a voltage across resistor $104_{R1}$ and with respect to $V_{EE}$, and similarly that current is also mirrored upward so as to cause a voltage across resistor $200_R$ with respect to $V_{CC}$. Each of these voltages is then passed through various base-emitter junctions to reach a respective node $100_{NN}$ and $100_{NP}$ and to thereby present a steady-state DC voltage at those nodes. In addition, however, the voltage at those nodes $100_{NN}$ and $100_{NP}$ are coupled through respective resistors, $130_{R1}$ and $130_{R2}$ or $214_R$ and $216_R$, so as to influence the actual output of biasing signals VPDX, VNDX, VPDY, and VNDY. However, the remaining circuitry in circuit 100 may cause additional variations in these biasing signals, as further explored below.

Figure 10:
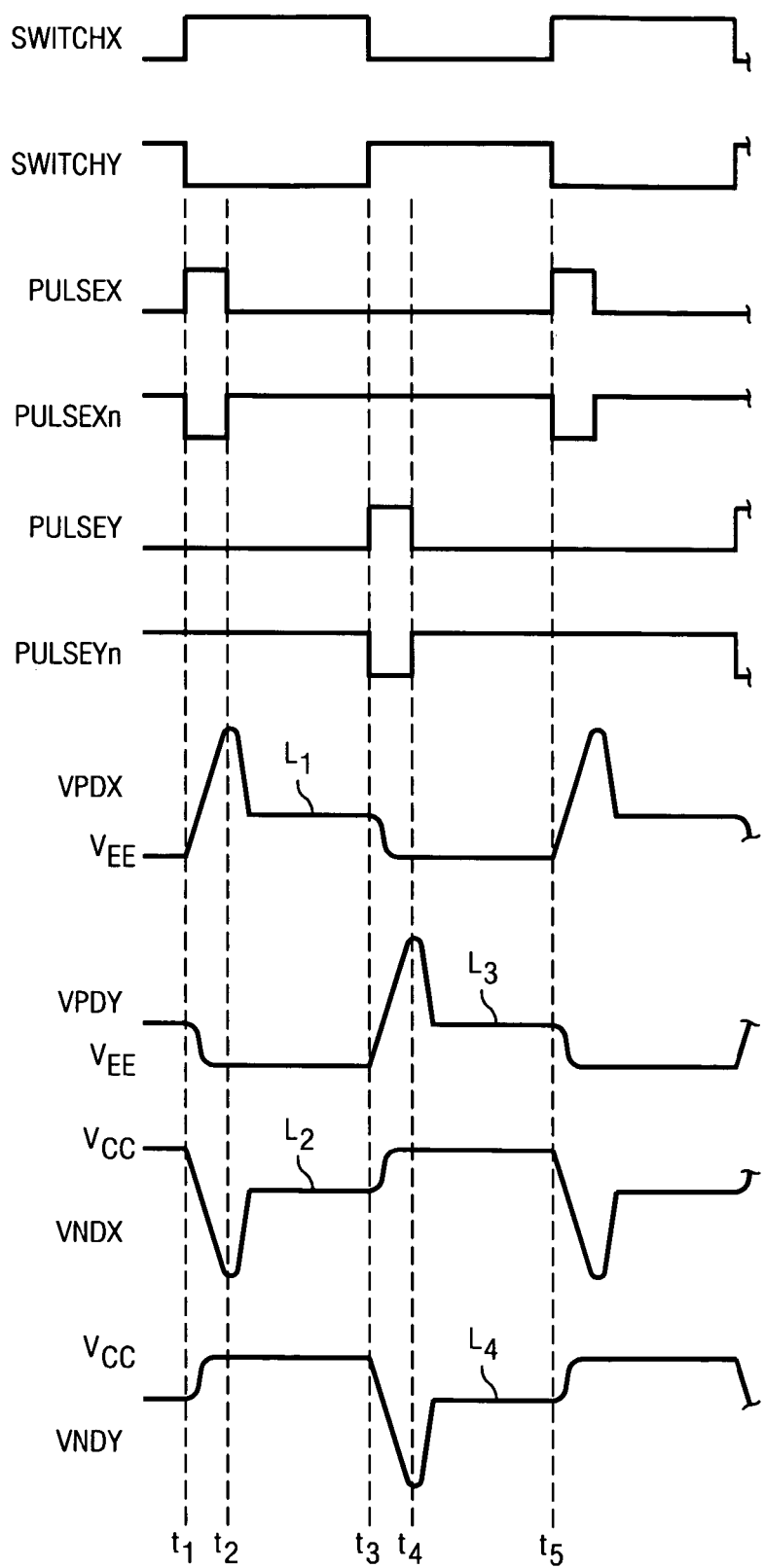
FIG. 10 illustrates a timing diagram of the operation of the circuit of FIGS. 9A, 9B, 9C, 9D, and 9E.

To further demonstrate the resulting biasing signals VPDX, VNDX, VPDY, and VNDY and the operation of circuit 100, that operation is further understood with reference to the tiring diagram of FIG. 10. Looking to FIG. 10, the upper two signals it illustrates are the SWICTHX and SWITCHY signals, which recall are used to operate switches $S_P$ and $S_N$ in circuit 100. Below those signals in FIG. 10 are the signals PULSEX and its inverse PULSEXn as well as PULSEY and its inverse PULSEYn, and recall these four signals are used to operate pulse circuits $P_P$ and $P_N$ in circuit 100.

In FIG. 10, at a time $t_1$, SWITCHX transitions high and SWITCHY transitions low. As a result in FIG. 9B, in switch $S_P$, PNP BJT $146_{B2}$ is turned on while PNP BJT $146_{B1}$ is turned off; thus, current flows through PNP BJT $146_{B2}$ and is connected to the emitter of NPN BJT $148_{B2}$, thereby causing that latter BJT to turn off. At the same time, with PNP BJT $146_{B1}$ off, then NPN BJT $148_{B1}$ is turned on, thereby pulling node $100_{NVPDY}$ toward $V_{EE}$. Accordingly, in FIG. 10, VPDY following $t_1$ is pulled toward $V_{EE}$. Returning to the signal VPDX, recall a voltage, offset from $V_{EE}$, is provided at node $100_{NN}$, representing the steady-state DC level responsive to the current from IW. Thus, at $t_1$, that voltage is coupled through resistor $130_{R1}$ and, thus, VPDX begins to rise from $V_{EE}$ to a level, $L_1$, equal to that voltage. However, also at $t_1$, PULSEX transitions high (and its complement, PULSEXn transitions low). As a result in pulse circuit $P_P$, current flows through PNP BJT $156_{B1}$ and creates an additional voltage spike (or "overshoot") in the waveform of VPDX following $t_1$. Further, note that as of time $t_2$, PULSEX and PULSEXn change respective states. At this point, therefore, the additional current from PNP BJT $156_{B1}$ is disabled and the VPDX waveform settles back to the level $L_1$. Similar, but symmetric, observations may be made with respect to VNDX in connection with times $t_1$ and $t_2$. Particularly, in switch $S_N$ of FIG. 9C, NPN BJT $246_{B2}$ is turned on while NPN BJT $246_{B1}$ is turned off; thus, current flows through NPN BJT $246_{B2}$ and is connected to the emitter of PNP BJT $248_{B2}$, thereby causing that latter BJT to turn off. At the same time, with NPN BJT $246_{B1}$ off, then PNP BJT $248_{B1}$ is turned on, thereby pulling node $100_{NVNDY}$ toward $V_{CC}$. Accordingly, in FIG. 10, VNDY following $t_1$ is pulled toward $V_{CC}$. Returning to the signal VNDX, recall a voltage, offset from $V_{CC}$, is provided at node $100_{NP}$, representing the steady-state DC level responsive to the current from IW. Thus, at ti, that voltage is coupled through resistor $216_R$ and, thus, VNDX begins to fall from $V_{CC}$ to a level, $L_2$, equal to that voltage. However, also at $t_1$, since PULSEX transitions high (and its complement, PULSEXn transitions low), in pulse circuit $P_N$ current flows through NPN BJT $264_{B1}$ and permits an additional voltage drop, or overshoot, away from $V_{CC}$ in the waveform of VNDX following $t_1$. Further, note that as of time $t_2$, PULSEX and PULSEXn change respective states. At this point, therefore, the additional current from NPN BJT $264_{B1}$ is disabled and the VNDX waveform settles back to the level $L_2$.

Continuing in time across FIG. 10 and with respect to VPDX and VNDX, at time $t_3$, SWITCHX transitions low and SWITCHY transitions high. In switch $S_P$, the transitions of SWITCHX and SWITCHY disables PNP BJT $146_{B2}$ and enables PNP BJT $146_{B1}$. As a result, current is provided by PNP BJT $146_{B1}$ to the emitter of NPN BJT $148_{B1}$ thereby disabling it, while NPN BJT $148_{B2}$ is enabled, thereby pulling node $100_{NVPDX}$ and the signal VPDX to $V_{EE}$, as shown in FIG. 10 following $t_3$. Thereafter, the signal VPDX remains at $V_{EE}$ until the next transition of SWITCHX and SWITCHY (i.e., at time $t_5$). In switch $S_N$, the $t_3$ transitions of SWITCHX and SWITCHY disable NPN BJT $246_{B2}$ and enable NPN BJT $246_{B1}$. As a result, current is provided by NPN BJT $246_{B1}$ to the emitter of PNP BJT $248_{B1}$ thereby disabling it, while PNP BJT 248B2 is enabled, thereby pulling node $100_{NVNDX}$ and the signal VNDX to $V_{CC}$, as shown in FIG. 10 following $t_3$. Thereafter, the signal VNDX remains at $V_{CC}$ until the next transition of SWITCHX and SWITCHY (i.e., at time $t_5$).

Looking now in time across FIG. 10 but with respect to VPDY and VNDY, at time $t_3$, again recall that the transitions of SWITCHX low and SWITCHY high disable PNP $146_{B2}$ in switch $S_P$ and NPN $246_{B2}$ in switch $S_N$. In response and with respect to switch $S_P$, and further in view of the transitions in PULSEY and PULSEYn at time $t_3$, first the voltage at node $100_{NN}$ is coupled through resistor $130_{R2}$ to node $100_{NVPDY}$ to provide level $L_3$ in VPDY, and the overshoot is then added from the enabled PNP BJT $164_{B1}$ in switch $P_P$. In response and with respect to switch $S_P$, and further in view of the transitions in PULSEY and PULSEYn at time $t_3$, first the voltage at node $100_{NP}$ is coupled through resistor $214_R$ to node $100_{NVNDY}$ to provide level $L_4$ in VNDY, and the overshoot provides a further offset from $V_{CC}$ by way of the enabled NPN BJT $256_{B1}$ in pulse circuit $P_N$.

From the above, the symmetry of the signals produced by circuit 100 also may be appreciated. For example, from time $t_1$ to time $t_3$, the VPDX and VNDX signals, used to simultaneously drive writer head assembly supply circuit 40 of FIGS. 8A-D, are substantially symmetric relative to one another, as in the manner as are HWX and HWY as shown earlier in connection with FIG. 4. Thus, these FIG. 10 signals are essentially amplified by writer head assembly supply circuit 40 to a larger scale, while maintaining their substantially symmetric nature. Similarly, from time $t_3$ to time $t_5$, the VNDY and VPDY signals, also used to simultaneously drive writer head assembly supply circuit 40 of FIGS. 8A-D, are also substantially symmetric relative to one another, as in the manner as are HWX and HWY as shown earlier in connection with FIG. 4. Thus, these FIG. 10 signals are also essentially amplified by writer head assembly supply circuit 40 to a larger scale, while maintaining their substantially symmetric nature.

From the preceding, various observations and benefits with respect to the preferred embodiments now are noteworthy of discussion and further relate to the symmetric nature of operation and resulting benefits also introduced earlier. The above has demonstrated that the preferred embodiment operates with four input signals to a writer head assembly supply circuit 40, wherein only two of those signals are active at a time and provide small-scale signals that are substantially symmetric with respect to one another. This embodiment provides a low derivative of the common mode voltage between the two active signals, which are amplified to provide substantially symmetric drive signals HWX and HWY for the disk drive write head. As another observation, note that such symmetry is achieved using a mix of PNP and NPN devices in each biasing signal path, that is, the transistor base-emitter junctions through which each biasing signal passes. Specifically, with respect to the signal VPDX as it traverses through circuit 40, first it is generated by a PNP BJT, namely, PNP BJT $122_{B2}$, and then with respect to circuit 40 it is connected through an NPN BJT $48_{2B1}$, a PNP BJT $48_{2B3}$ and an NPN BJT $48_{2B4}$ before it drives the transistors of driver $44_2$. With respect to the signal VNDY as it traverses through circuit 40, first it is generated by an NPN BJT, namely, NPN BJT $212_B$, and then with respect to circuit 40 it is connected through a PNP BJT $46_{1B1}$, an NPN BJT $46_{1B3}$, and PNP BJT $46_{1B4}$ before it drives the transistors of driver $44_2$. With respect to the signal VNDX as it traverses through circuit 40, first it is generated by NPN BJT $212_B$ and then with respect to circuit 40 it is connected through a PNP BJT $48_{1B1}$, an NPN BJT $48_{1B3}$, and a PNP BJT $48_{1B4}$ before it drives the transistors of driver $44_1$. Lastly, with respect to the signal VPDY as it traverses through circuit 40, first it is generated by PNP BJT $122_{B2}$ and then with respect to circuit 40 it is connected through an NPN BJT $46_{2B1}$, a PNP BJT $462_{B3}$, and an NPN BJT $46_{2B4}$ before it drives the transistors of driver $42_2$. Thus, in each instance, a signal passes through two BJTs of one conductivity type and then through two BJTs of the opposite conductivity type. With this connectivity and in a symmetric process, symmetric output signals may be achieved.

An additional benefit also arises from the preferred embodiment approach of circuit 100 in FIGS. 9A-E and circuit 40 of FIGS. 8A-D. Particularly, with a mix of PNP and NPN BJTs, the load of a $V_{BE}$ in one type of BJT (e.g., a $V_{BE}$ drop down through the base-emitter of an NPN BJT) may be offset by the opposite load in the opposite type of BJT (e.g., a $V_{BE}$ increase through the emitter-base of a PNP BJT). As a result, the DC bias of the pre-amplification signals provided by circuit 100 of FIGS. 9A-E may be reduced as compared to that which would be required to drive a signal path through multiple BJTs of the same type. With this reduced DC bias, power consumption is reduced as compared to an approach requiring greater voltage swings. Indeed, this also may be observed specifically in connection with switch $S_N$ and pulse circuit $P_N$ of circuit 100 in FIGS. 9A-E. Particularly, note that those devices and the BJTs to which they are connected are not coupled between the entire rail swing from $V_{CC}$ to $V_{EE}$; instead, they are only connected between $V_{CC}$ and ground (i.e., node $106_{NG}$). This approach is possible due to the lesser required voltage swings needed to drive circuit 40 of FIGS. 8A-D, while there is still ample voltage swing to avoid saturation of the BJTs in devices $S_N$ and $P_N$. As a result, less power is consumed as compared to a rail-to-rail approach.

From the above, it may be appreciated that the preferred embodiments provide an improved disk drive control circuit, such as may be included within a disk drive pre-amplifier, for providing voltage waveforms to drive the disk drive write mechanism. These voltage waveforms are detailed above and as also described provide numerous advantages over the prior art. Moreover, while specific connectivity and devices have been shown herein, one skilled in the art may make various adjustments while still falling within the inventive scope. Thus, while the present embodiments have been described in detail, various substitutions, modifications or alterations could be made to the descriptions set forth above without departing from the inventive scope which is defined by the following claims.

The invention claimed is:

1. A disk drive data storage system, comprising:
   a magnetic disk;
   a head for writing data to the disk;
   circuitry for providing a first voltage to a first node and a second voltage to a second node, wherein the head is coupled to the first and second nodes such that a data state is written to the disk in response to the first and second voltage, comprising:
   a first transistor of a first type and coupled to the first node;
   a first transistor of a second type and coupled to the second node;
   a second transistor of the first type and coupled to the second node; and
   a second transistor of the second type and coupled to the first node;
   circuitry for coupling a first biasing signal to the first transistor of the first type during a first time period, and comprising a signal path for the first biasing signal that passes through a base-emitter junction of transistors of both the first and second type;
   circuitry for coupling a second biasing signal to the first transistor of the second type during the first time period, and comprising a signal path for the second biasing signal that passes through a base-emitter junction of transistors of both the first and second type;
   circuitry for coupling a third biasing signal to the second transistor of the first type during a second time period that differs from the first time period, and comprising a signal path for the third biasing signal that passes through a base-emitter junction of transistors of both the first and second type; and
   circuitry for coupling a fourth biasing signal to the second transistor of the second type during the second time period, and comprising a signal path for the fourth biasing signal that passes through a base-emitter junction of transistors of both the first and second type.

2. The system of claim 1 wherein the first voltage and the second voltage are substantially symmetric relative to one another and with respect to a constant voltage level.

3. The system of claim 1 wherein the first voltage and the second voltage are substantially symmetric relative to one another.

4. The system of claim 1:
wherein the first type comprises a PNP type transistor; and
wherein the second type comprises an NPN type transistor.

5. The system of claim 1 and further comprising circuitry for generating the first, second, third, and fourth biasing signals.

6. The system of claim 5 wherein the circuitry for generating the first, second, third, and fourth biasing signals comprises:
circuitry for providing a DC voltage level; and
circuitry for temporarily coupling a voltage overshoot to the DC voltage level.

7. The system of claim 6 wherein the circuitry for providing a DC voltage level comprises:
a digital-to-analog converter for providing a current; and
a resistive element for providing a voltage offset from a reference voltage in response to the current.

8. The system of claim 5:
wherein the circuitry for generating the first and third biasing signals comprises:
circuitry for providing a first DC voltage level; and
circuitry for temporarily coupling a voltage overshoot to the first DC voltage level; and
wherein the circuitry for generating the second and fourth biasing signals comprises:
circuitry for providing a second DC voltage level; and
circuitry for temporarily coupling a voltage overshoot to the second DC voltage level.

9. The system of claim 8 and further comprising a digital-to-analog converter for providing a current, wherein the circuitry for providing a first DC voltage level of the circuitry for generating the first and third biasing signals and the circuitry for providing a second DC voltage level of the circuitry for generating the second and fourth biasing signals are both responsive to the current.

10. The system of claim 9:
wherein the circuitry for generating the first and third biasing signals further comprises a resistive element for providing a voltage offset from a first reference voltage in response to the current; and
wherein the circuitry for generating the second and fourth biasing signals further comprises a resistive element for providing a voltage offset from a second reference voltage in response to the current.

11. The system of claim 10:
wherein the circuitry for generating the first and third biasing signals comprises a signal path for the first and third biasing signals that passes from the resistive element for providing a voltage offset from the first reference voltage through a base-emitter junction of transistors of both the first and second type; and
wherein the circuitry for generating the second and fourth biasing signals comprises a signal path for the second and fourth biasing signals that passes from the resistive element for providing a voltage offset from the second reference voltage through a base-emitter junction of transistors of both the first and second type.

12. The system of claim 11:
wherein the circuitry for generating the second and fourth biasing signals comprises circuitry coupled between a first reference voltage and a second reference voltage;
wherein the circuitry for generating the first and third biasing signals comprises circuitry coupled between the first reference voltage and a third reference voltage, wherein the third reference voltage is at a level between the first and second voltage levels.

13. The system of claim 5:
wherein the circuitry for generating the first and third biasing signals comprises a signal path for the first and third biasing signals that passes through a base-emitter junction of transistors of both the first and second type; and
wherein the circuitry for generating the second and fourth biasing signals comprises a signal path for the second and fourth biasing signals that passes through a base-emitter junction of transistors of both the first and second type.

14. The system of claim 1:
wherein the first and second voltages have an approximately equal peak absolute value; and
wherein a derivative of a common mode voltage of the first and second voltages is on the order of $10^9$/sec times the equal peak absolute value.

15. The system of claim 1:
wherein the first voltage and the second voltage are substantially symmetric relative to one another and with respect to a constant voltage level;
wherein the first type comprises a PNP type transistor; and
wherein the second type comprises an NPN type transistor.

16. The system of claim 1:
wherein a collector of the first transistor of the first type is connected to the first node;
wherein a collector of the first transistor of the second type is connected to the second node;
wherein a collector of the second transistor of the first type is connected to the second node; and
wherein a collector of the second transistor of the second type is connected to the first node.

17. The system of claim 16:
wherein the first biasing signal is connected to a base of the first transistor of the first type;
wherein the second biasing signal is connected to a base of the first transistor of the second type;
wherein the third biasing signal is connected to a base of the second transistor of the first type; and
wherein the fourth biasing signal is connected to a base of the second transistor of the second type.

18. The system of claim 1 wherein all of the circuitry for providing a first voltage and a second voltage, circuitry for coupling a first biasing signal, circuitry for coupling a second biasing signal, circuitry for coupling a third biasing signal, and circuitry for coupling a fourth biasing signal are formed on a flexible circuit board.

19. The system of claim 1 wherein all of the circuitry for providing a first voltage and a second voltage, circuitry for coupling a first biasing signal, circuitry for coupling a second biasing signal, circuitry for coupling a third biasing signal, and circuitry for coupling a fourth biasing signal are formed in germanium-silicon on a flexible circuit board.

20. The system of claim 1 wherein all of the circuitry for providing a first voltage and a second voltage, circuitry for coupling a first biasing signal, circuitry for coupling a second biasing signal, circuitry for coupling a third biasing signal, and circuitry for coupling a fourth biasing signal comprise germanium-silicon circuitry.

21. Circuitry for use in a disk drive data storage system comprising a magnetic disk and a head for writing data to the disk, comprising:

circuitry for providing a first voltage to a first node and a second voltage to a second node, wherein the head is coupled to the first and second nodes such that a data state is written to the disk in response to the first and second voltage, comprising:
    a first transistor of a first type and coupled to the first node;
    a first transistor of a second type and coupled to the second node;
    a second transistor of the first type and coupled to the second node; and
    a second transistor of the second type and coupled to the first node;
circuitry for coupling a first biasing signal to the first transistor of the first type during a first time period, and comprising a signal path for the first biasing signal that passes through a base-emitter junction of transistors of both the first and second type;
circuitry for coupling a second biasing signal to the first transistor of the second type during the first time period, and comprising a signal path for the second biasing signal that passes through a base-emitter junction of transistors of both the first and second type;
circuitry for coupling a third biasing signal to the second transistor of the first type during a second time period that differs from the first time period, and comprising a signal path for the third biasing signal that passes through a base-emitter junction of transistors of both the first and second type; and
circuitry for coupling a fourth biasing signal to the second transistor of the second type during the second time period, and comprising a signal path for the fourth biasing signal that passes through a base-emitter junction of transistors of both the first and second type.

\* \* \* \* \*